(12) United States Patent
Oshima et al.

(10) Patent No.: US 9,054,204 B2
(45) Date of Patent: Jun. 9, 2015

(54) THIN-FILM TRANSISTOR, METHOD OF MANUFACTURING THE SAME, DISPLAY UNIT, AND ELECTRONIC APPARATUS

(71) Applicant: Sony Corporation, Tokyo (JP)

(72) Inventors: Yoshihiro Oshima, Kanagawa (JP); Takashige Fujimori, Kanagawa (JP); Yasunobu Hiromasu, Kanagawa (JP); Yasuhiro Terai, Kanagawa (JP)

(73) Assignee: Sony Corporation, Tokyo (JP)

( * ) Notice: Subject to any disclaimer, the term of this patent is extended or adjusted under 35 U.S.C. 154(b) by 11 days.

(21) Appl. No.: 13/738,540

(22) Filed: Jan. 10, 2013

(65) Prior Publication Data

US 2013/0187164 A1     Jul. 25, 2013

(30) Foreign Application Priority Data

Jan. 20, 2012 (JP) ................ 2012-009913
Mar. 27, 2012 (JP) ................ 2012-071028

(51) Int. Cl.

| H01L 29/12 | (2006.01) |
|---|---|
| H01L 27/12 | (2006.01) |
| H01L 21/84 | (2006.01) |
| H01L 29/786 | (2006.01) |
| H01L 29/66 | (2006.01) |

(52) U.S. Cl.
CPC .... *H01L 29/78693* (2013.01); *H01L 29/66742* (2013.01); *H01L 29/78606* (2013.01); *H01L 29/78633* (2013.01); *H01L 29/7869* (2013.01); *H01L 29/66969* (2013.01)

(58) Field of Classification Search
CPC .............. H01L 29/78693; H01L 29/66742; H01L 29/7869; H01L 29/786; H01L 29/66765; H01L 29/78669; H01L 29/66; H01L 27/1237; H01L 27/1214; H01L 27/1288; H01L 27/1251; H01L 27/1259; H01L 27/3248; H01L 27/12; H01I 27/3272; H01I 27/1251

USPC .......... 257/347, E21.409, E27.112, E29.273, 257/59, 57, 43, 104, E21.427, E29.296, 257/E21.476, E21.431, E21.619, E21.628, 257/E29.267, E29.268, E21.412, E29.068, 257/E29.291, E29.151; 438/151, 153, 154, 438/158, 164, 149, 142, 301, 290, 294, 296, 438/299, 303, 305, 306, 479, 738, 740, 924, 438/970, 40, 43, 634, 708, 709, 104, 608, 438/262, 722, 30, 29; 349/139, 143, 147

See application file for complete search history.

(56) References Cited

U.S. PATENT DOCUMENTS

| 2009/0149030 A1* | 6/2009 | Chang .................... 438/752 |
| 2010/0059751 A1* | 3/2010 | Takahashi et al. ........ 257/57 |
| 2011/0248260 A1* | 10/2011 | Yamazaki ................ 257/43 |
| 2013/0056741 A1* | 3/2013 | Harumoto et al. ........ 257/59 |

FOREIGN PATENT DOCUMENTS

| JP | 2010-098280 | 4/2010 |
| JP | 2011-187506 | 9/2011 |
| JP | 2012-004371 | 1/2012 |

OTHER PUBLICATIONS

Lee, et al., The effect of moisture on the photon-enhanced negative bias thermal instability in Ga—In—Zn—O thin film transistors, Applied Physics Letters 95, 232106 (2009).
Gosain, et al., Instability of Amorphous Indium Gallium Zinc Oxide Thin Film Transistors under Light Illumination, Japanese J of Applied Physics 48 (2009).

* cited by examiner

*Primary Examiner* — Chuong A Luu
*Assistant Examiner* — Moazzam Hossain
(74) *Attorney, Agent, or Firm* — K&L Gates LLP

(57) ABSTRACT

There are provided a thin-film transistor suppressing influence of light and having stable characteristics, and a method of manufacturing the thin-film transistor, as well as a display unit and an electronic apparatus. The thin-film transistor includes: a gate electrode; an oxide semiconductor film having a channel region that faces the gate electrode; and a protective film covering at least the channel region and containing an aluminum lower oxide ($Al_xO_y$, where $0<Y/X<3/2$) that absorbs light.

7 Claims, 21 Drawing Sheets

THIN-FILM TRANSISTOR, METHOD OF MANUFACTURING THE SAME, DISPLAY UNIT, AND ELECTRONIC APPARATUS

CROSS REFERENCES TO RELATED APPLICATIONS

The present application claims priority to Japanese Priority Patent Application JP 2012-009913 filed in the Japan Patent Office on Jan. 20, 2012, and JP 2012-071028 filed in the Japan Patent Office on Mar. 27, 2012, the entire content of which is hereby incorporated by reference.

BACKGROUND

The present application relates to a thin-film transistor (TFT) using an oxide semiconductor, a method of manufacturing the same, and a display unit as well as an electronic apparatus each having the thin-film transistor.

In recent years, with increases in size and definition of displays, there has been demand for high mobility in TFTs of drive devices. Therefore, there have been actively developed TFTs using oxide semiconductors such as zinc (Zn) oxide, indium (In) oxide, gallium (Ga) oxide, tin (Sn) oxide, aluminum (Al) oxide, titanium (Ti) oxide, and a mixture of any of these oxides. It has been found that TFTs using complex oxides of Zn, In, and Ga, in particular, have large electron mobility and exhibit excellent electrical properties, as compared with TFTs using amorphous silicon (a-Si:H) usually employed in liquid crystal displays, etc.

Among such TFTs using oxide semiconductors, those having a bottom-gate type structure and those having a top-gate type structure have been reported so far. In the bottom-gate type structure, a thin-film layer made of an oxide semiconductor is provided on a gate electrode, with a gate insulating film interposed therebetween. This structure is similar to a currently-commercialized TFT structure in which amorphous silicon is used as a channel. For this reason, a manufacturing process of the currently-available TFT employing amorphous silicon is readily used for the TFTs having the bottom-gate type structure. Thus, the bottom-gate type structure is often employed in the TFTs using oxide semiconductors.

In addition, for improvement of the reliability of the oxide semiconductor TFTs, it has been proposed to form a protective film made of $Al_2O_3$ or the like on a drain electrode and a source electrode made of aluminum, molybdenum, ITO, and the like (for example, see Toshiaki Arai et al., SID 10 Digest (2010), and Japanese Unexamined Patent Application Publication Nos. 2011-187506 and 2012-4371).

It can be said that the oxide semiconductor has characteristics in which contact between a semiconductor film and a transparent oxide electrode is possible because the channel itself is an oxide. Therefore, a completely transparent display can be expected to be realized. In a transparent display, not only TFTs but also flattening films as well as electrodes are made transparent so that high transmittance is achieved. Meanwhile, light emitted as backlight from EL devices and the like directly enters the TFTs, because each layer is transparent as described above. In particular, when the wavelength of the incident light is in the range of ultraviolet light, operation of an oxide semiconductor device is destabilized. For this reason, in order to realize a highly reliable transparent display, it is necessary to block the above-described light incident upon the TFTs. In this regard, it has been proposed to provide a light-shielding film, for example, by forming a flattening film on a source electrode and a drain electrode, and then forming an electrode thereon (for example, see C. S. Chuang et al., SID 08 Digest (2008)).

Further, it has been proposed that, when a transparent conductive film is used as a wiring of an active matrix display, a low-resistance wiring in which a main part of the above-mentioned wiring is made of Al or the like is routed for the purpose of reducing wiring resistance (for example, see Japanese Unexamined Patent Application Publication No. 2010-98280).

SUMMARY

TFTs using oxide semiconductors are easily affected by visible light of a relatively short wavelength, as described in, for example, D. P. Gosain and T. Tanaka: "Instability of Amorphous Indium Gallium Zinc Oxide Thin Film Transistors under Light Illumination", JJAP 48, 03B018, 2009, and K.-H. Lee, J. S. Jung, K. S. Son, J. S. Park, T. S. Kim, R. Choi, J. K. Jeong, J.-Y. Kwon, B. Koo, and S. Lee: "The effect of moisture on the photon-enhanced negative bias thermal instability in Ga—In—Zn—O thin film transistors", APL 95, 232106, 2009. This disadvantageously causes a change in the TFT properties. The former document mentioned above describes the TFT threshold voltage shifting negatively by light having a wavelength of 440 nm. In the latter document mentioned above, a change in the TFT properties is examined by applying a negative bias to a gate electrode under optical irradiation.

Thus, it is a challenge to provide a thin-film transistor applicable to a transparent display and having better initial properties and higher reliability than those of ordinary thin-film transistors.

It is desirable to provide a thin-film transistor suppressing influence of light and having stable characteristics, and a method of manufacturing the thin-film transistor, as well as a display unit and an electronic apparatus.

According to an embodiment of the present application, there is provided a first thin-film transistor including: a gate electrode; an oxide semiconductor film having a channel region that faces the gate electrode; and a protective film covering at least the channel region and containing an aluminum lower oxide ($Al_xO_y$, where $0<Y/X<3/2$) that absorbs light.

According to an embodiment of the present application, there is provided a display unit provided with a plurality of devices and a thin-film transistor driving the plurality of devices. The thin-film transistor includes: a gate electrode; an oxide semiconductor film having a channel region that faces the gate electrode; and a protective film covering at least the channel region and containing an aluminum lower oxide ($Al_xO_y$, where $0<Y/X<3/2$) that absorbs light.

According to an embodiment of the present application, there is provided an electronic apparatus with a display unit that is provided with a plurality of devices and a thin-film transistor driving the plurality of devices. The thin-film transistor includes: a gate electrode; an oxide semiconductor film having a channel region that faces the gate electrode; and a protective film covering at least the channel region and containing an aluminum lower oxide ($Al_xO_y$, where $0<Y/X<3/2$) that absorbs light.

In the thin-film transistor according to the above-described embodiment of the present application, light, in particular, visible light of a relatively small wavelength is absorbed by the aluminum lower oxide contained in the protective film.

According to an embodiment of the present application, there is provided a first method of manufacturing a thin-film transistor. The method includes: forming an oxide semiconductor film on a gate electrode, the oxide semiconductor film having a channel region that faces the gate electrode; and forming a protective film covering at least the channel region, the protective film containing an aluminum lower oxide ($Al_XO_Y$, where $0<Y/X<3/2$) that absorbs light.

According to an embodiment of the present application, there is provided a second thin-film transistor including: a gate electrode; a gate insulating film provided to cover the gate electrode; an oxide semiconductor film provided on the gate insulating film; a source electrode and a drain electrode each made of a transparent conductive oxide, and provided on the oxide semiconductor film; a protective film made of a metal oxide, and provided on the source electrode and the drain electrode; and a light-shielding film provided on the protective film. A distance between the oxide semiconductor film and the light-shielding film is about 2 nm or more and about 400 nm or less.

According to an embodiment of the present application, there is provided a second method of manufacturing a thin-film transistor. The method includes: forming a gate electrode on a substrate; forming a gate insulating film covering the gate electrode; forming an oxide semiconductor film on the gate insulating film; forming a channel protective film on the oxide semiconductor film; forming each of a source electrode and a drain electrode on the oxide semiconductor film, the source electrode and the drain electrode each being made of a transparent conductive oxide; and forming a protective film made of a metal oxide on the source electrode and the drain electrode, and forming a light-shielding film on the protective film. A distance between the oxide semiconductor film and the light-shielding film is about 2 nm or more and about 400 nm or less.

According to an embodiment of the present application, there is provided a display unit including a thin-film transistor and a pixel on a substrate. The thin-film transistor includes: a gate electrode; a gate insulating film provided to cover the gate electrode; an oxide semiconductor film provided on the gate insulating film; a source electrode and a drain electrode made of a transparent conductive oxide, and provided on the oxide semiconductor film; a protective film made of a metal oxide, and provided on the source electrode and the drain electrode; and a light-shielding film provided on the protective film. A distance between the oxide semiconductor film and the light-shielding film is about 2 nm or more and about 400 nm or less.

The transparent conductive oxide forming the source electrode and the drain electrode is not basically limited, as long as it is a transparent oxide having conductivity. However, preferably, the transparent conductive oxide has high conductivity, and more preferably, further has a high degree of light transmission. As the transparent conductive oxide, a transparent conductive oxide semiconductor may be typically used. As the transparent conductive oxide semiconductor, when it is an n-type semiconductor, there may be used, for example, specifically, an oxide in which a base material is zinc oxide (ZnO), indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), molybdenum oxide ($MoO_3$), or the like. $Ga_2O_3$ is preferably $\beta$-$Ga_2O_3$ having a most stable structure. Here, examples of the oxide using ZnO as the base material include AZO, GZO, IZO, and FZO. Further, examples of the oxide using $In_2O_3$ as the base material include ITO and FTO. Furthermore, examples of the oxide using $SnO_2$ as the base material include ATO and FTO. As the transparent conductive oxide semiconductor, when it is a p-type semiconductor, there may be used, for example, specifically, an oxide in which a base material is $CuAlO_2$, LaCuOS, LaCuOSe, $SrCu_2O_2$, NiO, or the like. However, the transparent conductive oxide is limited to none of the above-enumerated examples.

The source electrode and the drain electrode are not basically limited in terms of thickness, but are preferably as thin as possible. Specifically, for example, the source electrode and the drain electrode each have a thickness of, preferably, about 1 nm or more and about 200 nm or less; more preferably, about 100 nm or more and about 200 nm or less; and still more preferably, about 150 nm or more and about 200 nm or less, without being limited to these thicknesses. In addition, the thickness of the source electrode and that of the drain electrode may be the same or different, but are preferably the same.

The metal oxide forming the protective film is not basically limited, but is preferably a material with high electric insulation, and more preferably, a stable substance. As the metal oxide, metallic oxynitride may also be used. Specific examples of the metal oxide include aluminum oxide ($Al_2O_3$), titanium oxide ($TiO_2$), zinc oxide (ZnO), indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), and molybdenum oxide ($MoO_3$). $TiO_2$ is preferably of a rutile type which has a most stable structure. $Ga_2O_3$ is preferably $\beta$-$Ga_2O_3$ having a most stable structure. As the metallic oxynitride, specifically, for example, aluminum oxynitride, titanium oxynitride, and the like may be used, although the metal oxide is not limited to these examples.

The protective film is not basically limited in terms of thickness, but is preferably as thin as possible. Specifically, for example, the protective film has a thickness of, preferably, about 1 nm or more and about 200 nm or less; more preferably, about 100 nm or more and about 200 nm or less; and still more preferably, about 150 nm or more and about 200 nm or less, without being limited to these thicknesses.

According to the first thin-film transistor, the first method of manufacturing the same, the display unit, and the electronic apparatus in the above-described embodiments of the present application, the aluminum lower oxide is contained in the protective film. Thus, entry of visible light with a short wavelength into the channel region is preventable. Therefore, improvement in resistance to light is achievable, and TFT properties are allowed to be stabilized.

In addition, according to the second thin-film transistor, the second method of manufacturing the same, since the protective film made of the metal oxide is formed on the source electrode and the drain electrode, the present application is applicable to a transparent display and the like, and a thin-film transistor with higher initial properties and higher reliability than those of ordinary thin-film transistors is achievable. Moreover, a high-performance display unit using the above-described superior thin-film transistor is also achievable.

It is to be understood that both the foregoing general description and the following detailed description are exemplary, and are intended to provide further explanation of the present application as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve used to describe the principles of the present application.

DETAILED DESCRIPTION

Embodiments of the present application will be described below in detail with reference to the drawings. It is to be noted that the description will be provided in the following order.
1. First embodiment (an example in which a passivation film has a lower oxide layer)
2. Modification (an example in which a channel protective film has a lower oxide layer)
3. Second embodiment
4. Third embodiment
5. Application examples (examples using an organic EL (Electroluminescence) display unit)
[First Embodiment]

Figure 1:
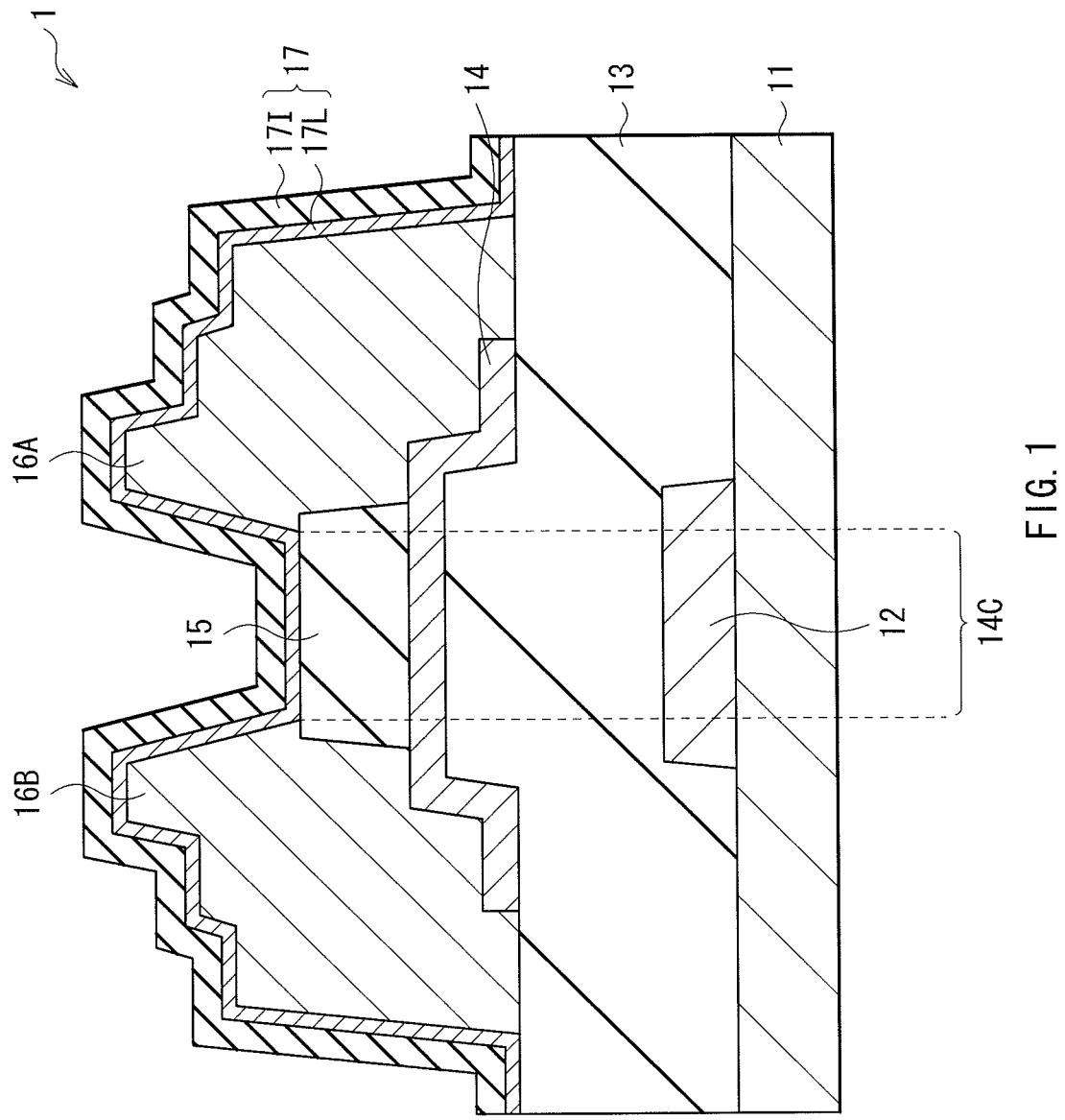
FIG. 1 is a cross-sectional diagram illustrating a configuration of a thin-film transistor according to a first embodiment of the present application.

FIG. 1 illustrates a cross-sectional configuration of a thin-film transistor 1 of a bottom-gate type (an inverted staggered type) according to a first embodiment of the present application. The thin-film transistor 1 is a TFT using an oxide semiconductor material for a semiconductor film (a semiconductor film 14). The thin-film transistor 1 is used, for example, as a drive device in a display such as an organic EL display. In this thin-film transistor 1, a gate electrode 12, a gate insulating film 13, the semiconductor film 14 (an oxide semiconductor film) having a channel region 14C, a channel protective film 15 (a first protective film), and a pair of source-drain electrodes 16A and 16B are provided in this order on a substrate 11. On the source-drain electrodes 16A and 16B, a passivation film 17 (a second protective film) is provided over the entire surface of the substrate 11.

The substrate 11 is configured using a glass substrate, a plastic film, or the like. As a plastic material, for example, PET (polyethylene terephthalate), PEN (polyethylene naphthalate), or the like may be used. When it is possible to form the semiconductor film 14 through sputtering or the like without heating the substrate 11, an inexpensive plastic film may be used for the substrate 11.

The gate electrode 12 serves to apply a gate voltage to the thin-film transistor 1, and control a carrier density in the semiconductor film 14 by using this gate voltage. The gate electrode 12 is provided in a selective region on the substrate 11. The gate electrode 12 is made of, for example, a simple metal such as platinum (Pt), titanium (Ti), ruthenium (Ru), molybdenum (Mo), copper (Cu), tungsten (W), nickel (Ni), aluminum (Al), and tantalum (Ta), or an alloy of any of these metals. Two or more of these metals may be laminated and used.

The gate insulating film 13 is provided between the gate electrode 12 and the semiconductor film 14, and has, for example, a thickness in a range of about 50 nm to about 1 μm.

The gate insulating film 13 is formed of an insulating film including, for example, one or more of a silicon oxide film (SiO), a silicon nitride film (SiN), a silicon oxynitride film (SiON), a hafnium oxide film (HfO), an aluminum oxide film (AlO), an aluminum nitride film (AlN), a tantalum oxide film (TaO), a zirconium oxide film (ZrO), a hafnium oxynitride film, a hafnium silicon oxynitride film, an aluminum oxynitride film, a tantalum oxynitride film, and a zirconium oxynitride film. The gate insulating film 13 may have a single-layered structure, or a laminated structure including, for example, two or more kinds of films such as SiN and SiO. When the gate insulating film 13 has the laminated structure including two or more kinds of films, it is possible to improve interfacial quality with the semiconductor film 14 and effectively suppress entry of impurities from fresh air into the semiconductor film 14.

The semiconductor film 14 is shaped like an island and provided on the gate insulating film 13, and has the channel region 14C in a position facing the gate electrode 12 provided between the source-drain electrodes 16A and 16B. The semiconductor film 14 is made of an oxide semiconductor in which, for example, an oxide of one or more elements of In, Ga, Zn, Sn, Al, and Ti is contained as the main component. The semiconductor film 14 has, for example, a thickness of about 5 nm to about 100 nm.

The channel protective film 15 is provided on the semiconductor film 14, and prevents the semiconductor film 14 (the channel region 14C) from being damaged at the time of forming the source-drain electrodes 16A and 16B. The channel protective film 15 is configured using, for example, an aluminum oxide film, a silicon oxide film, or a silicon nitride film, and has a thickness of about 150 nm to about 300 nm, which is preferably about 200 nm to about 250 nm.

The pair of source-drain electrodes 16A and 16B are provided apart from each other on the semiconductor film 14 and the channel protective film 15, and electrically connected to the semiconductor film 14. For the source-drain electrodes 16A and 16B, a material similar to that of the gate electrode 12 may be used. Specifically, a single layer film made of an element such as Al, Mo, Ti, and Cu, or a laminated film made of two or more of these elements may be used for the source-drain electrodes 16A and 16B.

The passivation film 17 covers the channel region 14C as well as the source-drain electrodes 16A and 16B, and prevents the semiconductor film 14 from deteriorating due to entry of hydrogen gas and oxygen gas, or adhesion of water. In the first embodiment, this passivation film 17 includes a lower oxide layer 17L. This makes it possible to improve light resistance of the thin-film transistor 1.

The lower oxide layer 17L is made of an aluminum lower oxide ($Al_XO_Y$, where $0<Y/X<3/2$), and absorbs visible light, in particular, light having a comparatively short wavelength of about 450 nm or less. An aluminum lower oxide is colored (black to brown) due to absorption of light in a short wavelength range, whereas an aluminum oxide ($Al_2O_3$) in the complete oxidation state is colorless and transparent. The oxidation state of this aluminum lower oxide is formed in a region called "metal region (a metal mode)" (i.e., a state L in FIG. 4 which will be described later).

Figure 2:
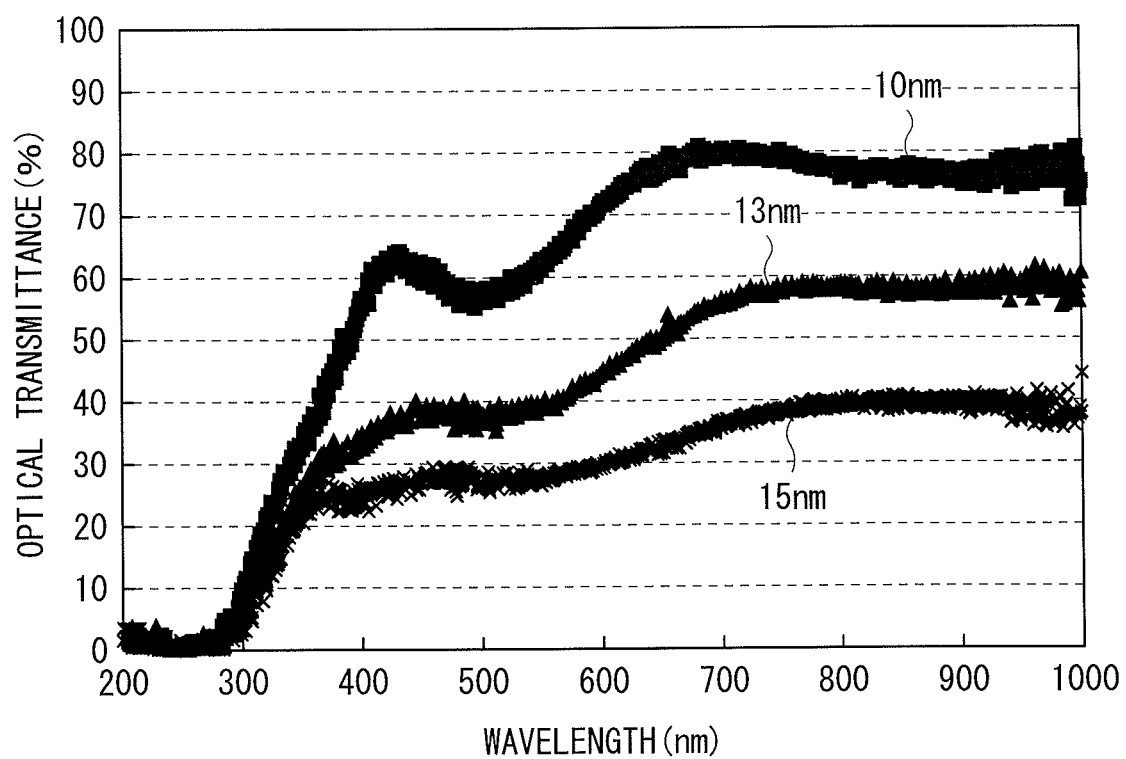
FIG. 2 is a diagram used to explain light absorption of a passivation film illustrated in FIG. 1.

FIG. 2 illustrates spectral transmittance when the thickness of the lower oxide layer 17L is each of 10 nm, 13 nm, and 15 nm. The horizontal axis indicates wavelengths (nm), and the vertical axis indicates optical transmittance (%). The optical transmittance of a wavelength in the neighborhood of 440 nm is 60% or less when the thickness of the lower oxide layer 17L is 10 nm, and decreases to 40% or less when is 13 nm, and further to 30% or less when is 15 nm. Thus, it is apparent that the lower oxide layer 17L well absorbs the light with wavelengths in the neighborhood of 440 nm.

The passivation film 17 has an insulating layer 17I, besides the lower oxide layer 17L described above. The insulating layer 17I is made of an insulating material other than the aluminum lower oxide, namely, for example, an aluminum oxide film ($Al_2O_3$), a silicon oxide film, a silicon nitride film, or the like in the complete oxidation state. In particular, the silicon nitride film or the aluminum oxide film with a high barrier property is preferable, and use of the aluminum oxide film is more preferable because a manufacturing process is easy as will be described later. The oxidation state of this aluminum oxide film is formed in a region called "oxidation region (a poison mode)" (a state H in FIG. 4 which will be described later). The thickness of the passivation film 17 is preferably, for example, about 20 nm to about 100 nm, and more preferably, about 40 nm to about 50 nm. The lower oxide layer 17L is capable of effectively absorbing the light with a wavelength of about 450 nm or less when the thickness thereof is about 5 nm or more, but this thickness is preferably about 15 nm.

Figure 3A:
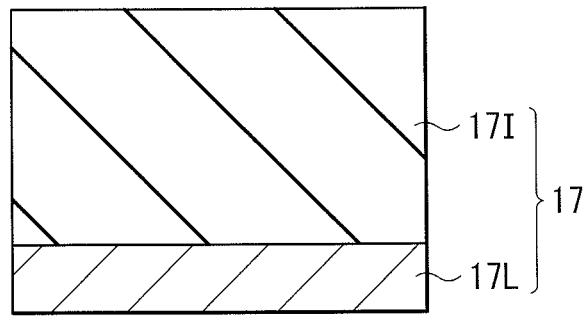
FIGS. 3A to 3C are cross-sectional diagrams illustrating a modification of laminating order for a lower oxide layer and an insulating layer in the passivation film illustrated in FIG. 1.
Figure 3B:
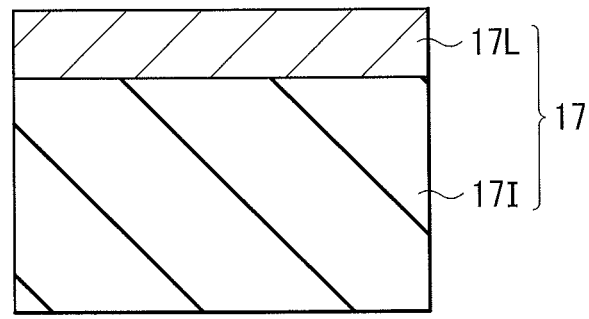
Figure 3C:
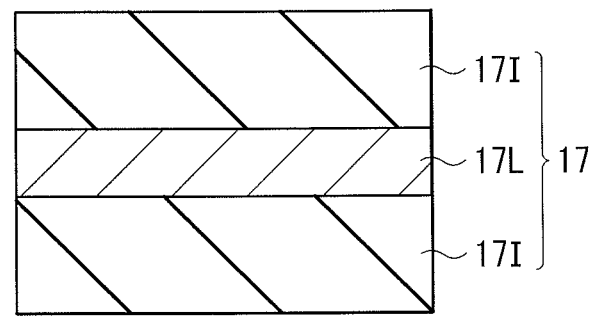

As illustrated in FIG. 3A, the passivation film 17 may be provided with the lower oxide layer 17L and the insulating layer 17I formed in this order from the semiconductor film 14 (the source-drain electrodes 16A and 16B) side (FIG. 1), or these layers may be formed in the reverse order as illustrated in FIG. 3B. Alternatively, a plurality of the insulating layers 17I may be provided, and the lower oxide layer 17L may be disposed between a pair of the insulating layers 17I as illustrated in FIG. 3C. Further, the passivation film 17 may have a plurality of the lower oxide layers 17L. When the lower oxide layer 17L has a sufficient insulation property, the insulating layer 17I may be omitted. However, from the viewpoint of reliably ensuring the insulation property, it is preferable to provide the lower oxide layer 17L between the insulating layers 17I (FIG. 3C). On the other hand, the passivation film 17 configured as illustrated in each of FIG. 3A and FIG. 3B can be readily manufactured.

The thin-film transistor 1 may be manufactured as follows, for example.

First, a metal film which will become the gate electrode 12 is formed on the entire surface of the substrate 11, using, for example, sputtering or vacuum deposition. This metal film is then patterned using, for example, photolithography and etching, so that the gate electrode 12 is formed.

Next, the gate insulating film 13 is formed by forming a silicon nitride film on the entire surfaces of the substrate 11 and the gate electrode 12, by Plasma Enhanced Chemical Vapor Deposition (PECVD), for example. Sputtering may be used to form the gate insulating film 13.

After the gate insulating film 13 is formed, the semiconductor film 14 made of the oxide semiconductor is formed on the gate insulating film 13. The semiconductor film 14 is formed by forming a film of an oxide semiconductor material on the gate insulating film 13 by, for example, DC (Direct Current) sputtering, and then patterning this film by using photolithography and etching. The film of the oxide semiconductor material may be formed using RF (Radio Frequency; high frequency) sputtering, but it is preferable to use the DC sputtering in view of a sedimentation rate.

Next, the channel protective film 15 is formed by forming an aluminum oxide film on the semiconductor film 14 by, for example, DC sputtering, and then patterning this aluminum oxide film. Subsequently, a metallic thin film is formed in a region including the channel protective film 15 on the semiconductor film 14 by sputtering, for example, and then this metallic thin film is etched, so that the source-drain electrodes 16A and 16B are formed. In this process, the semiconductor film 14 is protected by the channel protective film 15 and thus, it is possible to prevent the semiconductor film 14 from being damaged by etching.

After the source-drain electrodes 16A and 16B are formed, the passivation film 17 is formed on the source-drain electrodes 16A and 16B as well as the channel protective film 15. The passivation film 17 is formed as follows, for example. First, an aluminum thin film is formed on the entire surface of the substrate 11 by DC sputtering, and then naturally oxidized in the atmosphere, so that the lower oxide layer 17L is formed. Next, an aluminum oxide film is formed on this lower oxide layer 17L by, for example, DC sputtering, while supplying sufficient oxygen, so that the insulating layer 17I is formed. As a result, the passivation film 17 is formed.

Figure 4:
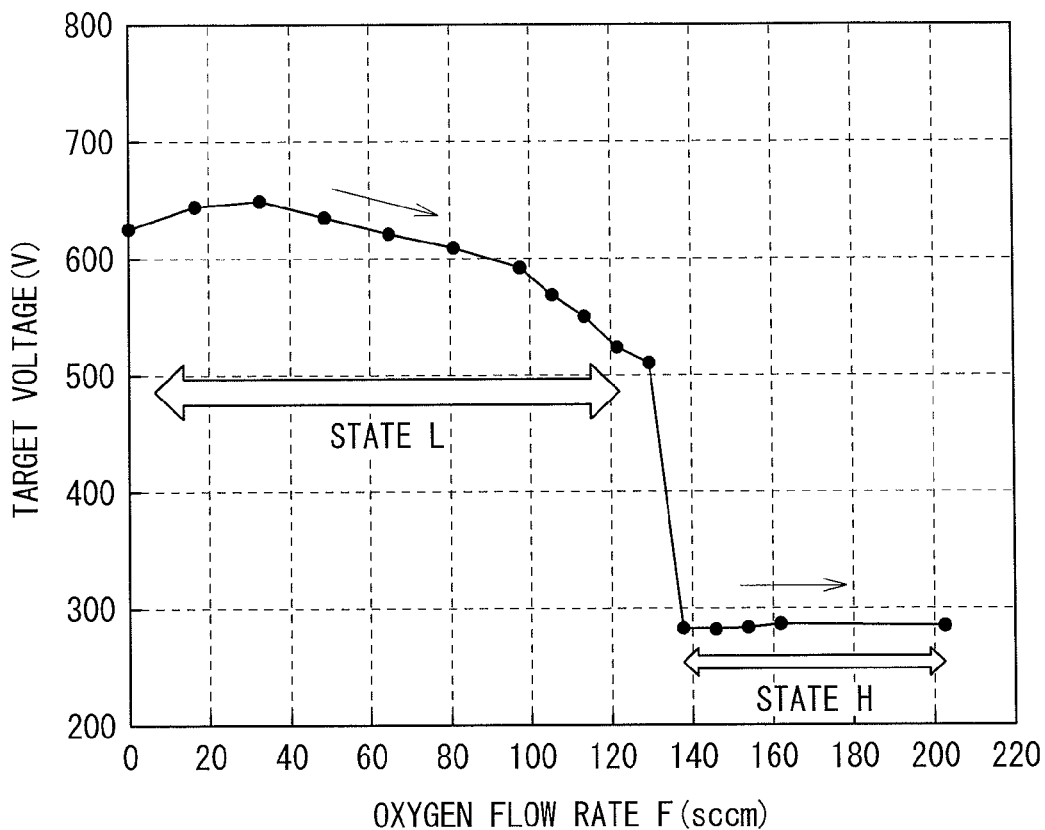
FIG. 4 is a diagram used to explain a method of forming the lower oxide layer illustrated in FIG. 1.

FIG. 4 illustrates a change in physical property of aluminum caused based on an oxygen supply quantity. The horizontal axis indicates an oxygen ($O_2$) flow rate (sccm) in a sputtering chamber at the time of DC sputtering, and the vertical axis indicates a target voltage (V) of a sputtering power source. Argon (Ar) gas is used for the DC sputtering. It is found from this figure that the target voltage gently decreases with increase in the oxygen flow rate, and suddenly drops at the oxygen flow rate in the vicinity of 130 (sccm). Such a change in the physical property of aluminum occurs due to complete coverage of the surface of aluminum (a sputtering target) by oxygen. The state before this change (the state L), i.e. a state when the oxygen flow rate F is 0<F≤130 (sccm), is equivalent to the oxidation state of the aluminum lower oxide (the above-mentioned metal mode). Aluminum does not have generation of carrier even in a state with a large oxygen deficiency and therefore, it is possible to maintain the insulation property even when the degree of oxidation is low. On the other hand, the state after the change (the state H), i.e., a state of F>130 (sccm) is equivalent to the complete oxidation state (the above-mentioned poison mode). It is to be noted that the oxygen flow rate F when the change from the state L to the state H takes place (130 (sccm) in this case) varies according to the condition and configuration of a unit.

In this way, configuring the insulating layer 17I by using the aluminum oxide film makes it possible to form the lower oxide layer 17L and the insulating layer 17I successively only by changing the oxygen supply quantity. In other words, it is possible to form the light-absorbing passivation film 17 easily.

In the thin-film transistor 1, when a gate voltage equal to or higher than a predetermined threshold voltage is applied to the gate electrode 12 through a wiring layer (not illustrated), carriers flow in the channel region 14C. As a result, a current flows between the source-drain electrodes 16A and 16B, and the thin-film transistor 1 functions as a transistor. Here, since the lower oxide layer 17L absorbing the light is included in the passivation film 17, entry of the light into the semiconductor film 14 (the channel region 14C) is blocked, which makes it possible to prevent the TFT properties from changing.

Figure 5:
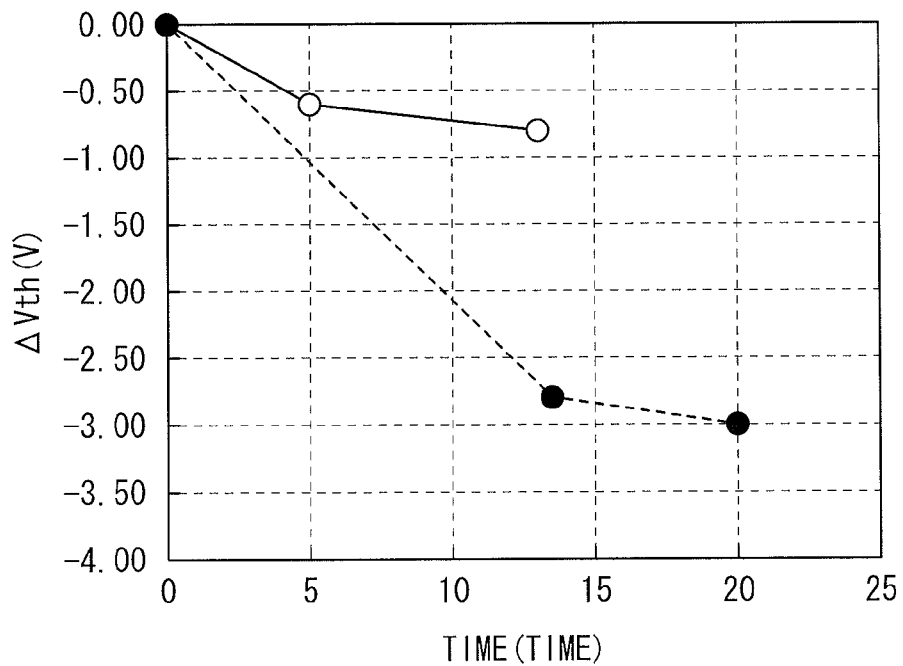
FIG. 5 is a diagram illustrating light resistance of the thin-film transistor illustrated in FIG. 1.

FIG. 5 illustrates a result of examining a change in the threshold voltage by irradiating the thin-film transistor with light having a wavelength of about 450 nm. The horizontal axis indicates irradiation time (time), and the vertical axis indicates a variation (V) of the threshold voltage.

When the passivation film is configured using only an aluminum oxide film (equivalent to the insulating layer 17I) in the complete oxidation state (a broken line in FIG. 5), a semiconductor film is affected by the light, and the threshold voltage greatly shifts in a negative direction. The reason for this is as follows. An oxide semiconductor has a band gap in the neighborhood of 3.4 V, and exhibits almost no light absorption in a range of visible light with relatively long wavelengths. On the other hand, the oxide semiconductor easily absorbs light in the band gap or in the level of the gap, i.e. light with relatively a short wavelength equal to or less than the wavelength in the neighborhood of 450 nm. Internal carriers are activated by this light absorption, which changes TFT properties. In particular, a lattice defect of such an oxide semiconductor affects the current transfer characteristic of the thin-film transistor. Although some ways of blocking the entry of light into a thin-film transistor have been proposed (for example, see Japanese Unexamined Patent Application Publication Nos. 5-74809 and 5-150232, and WO2004/075607), their manufacturing processes are all complicated.

In contrast, when the passivation film 17 is configured to include the lower oxide layer 17L having a thickness of about 15 nm (a solid line in FIG. 5), the threshold voltage hardly changes. Thus, in the thin-film transistor 1, the entry of the light into the semiconductor film 14 is prevented by providing the lower oxide layer 17L in the passivation film 17, and therefore suppression of a change in the threshold voltage is allowed. In addition, it is possible to manufacture the lower oxide layer 17L easily, by adjusting the oxygen supply quantity at the time of forming the passivation film 17.

In this way, in the first embodiment, since the lower oxide layer 17L is provided in the passivation film 17, it is possible to prevent the occurrence of a lattice defect of the semiconductor film 14 resulting from the optical irradiation, and stabilize the TFT properties.

Moreover, when the insulating layer 17I is configured using the aluminum oxide film, it is possible to readily form the passivation film 17 including the lower oxide layer 17L and the insulating layer 17I, only by changing the oxygen supply quantity.

[First Modification]

Figure 6A:
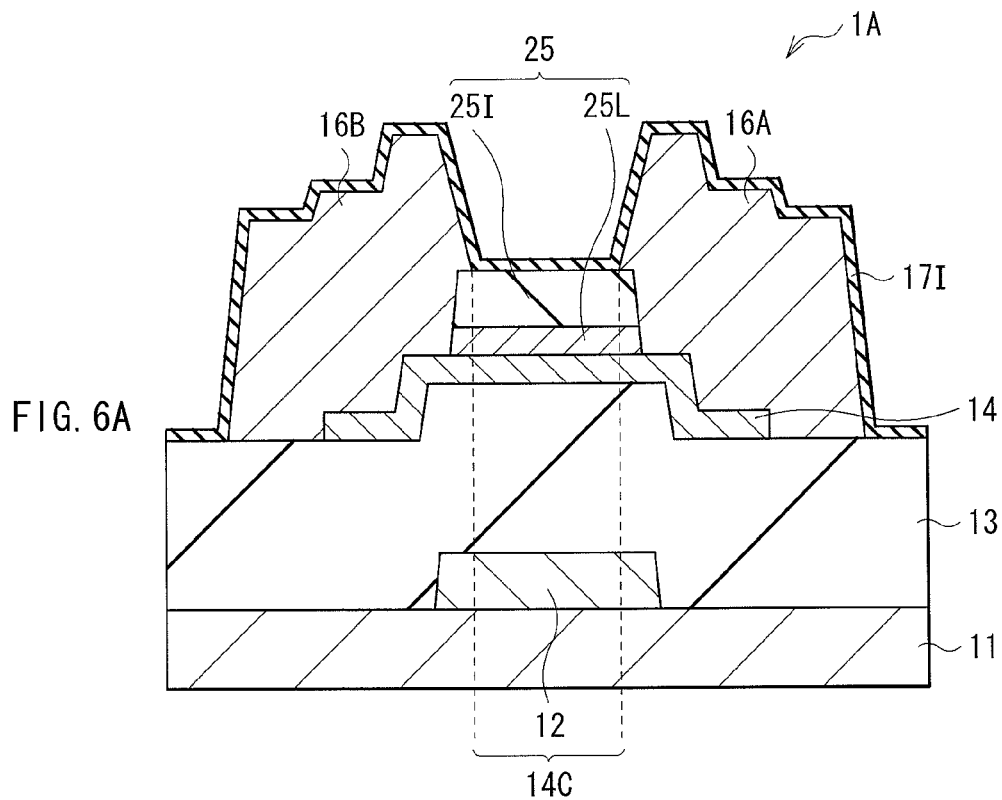
FIGS. 6A and 6B are cross-sectional diagrams each illustrating a configuration of a thin-film transistor according to a modification.

FIG. 6A illustrates a cross-sectional configuration of a thin-film transistor (a thin-film transistor 1A) according to a modification of the embodiment. This thin-film transistor 1A has a lower oxide layer (a lower oxide layer 25L) in a channel protective film (a channel protective film 25). Except for this point, the thin-film transistor 1A has a configuration, functions, and effects similar to those of the thin-film transistor 1 of the first embodiment described above.

Figure 6B:
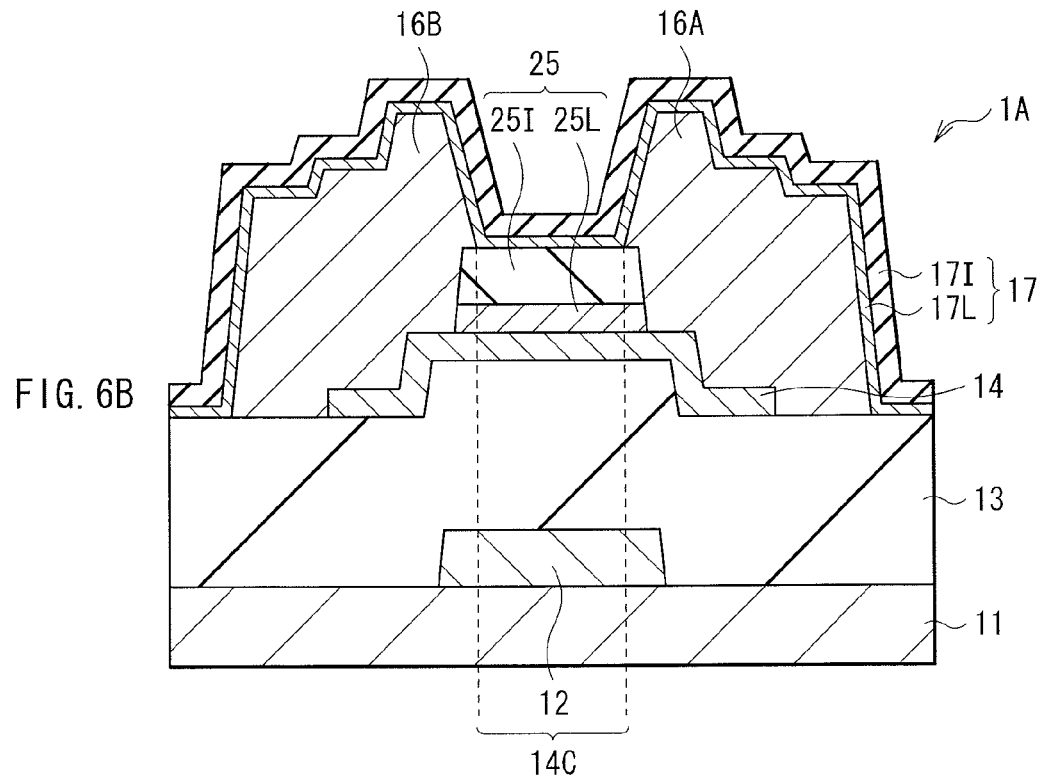

The channel protective film 25 is configured using the lower oxide layer 25L and an insulating layer 25I. The lower oxide layer 25L is made of an aluminum lower oxide, and the insulating layer 25I is made of an insulating material other than the aluminum lower oxide. Examples of the insulating material include an aluminum oxide film, a silicon oxide film, and a silicon nitride film. In this channel protective film 25, the lower oxide layer 25L and the insulating layer 25I may be formed in this order from the semiconductor film 14 side (FIG. 6) or may be formed in the reverse order. Alternatively, a plurality of the insulating layers 25I may be provided, and the lower oxide layer 25L may be provided between a pair of the insulating layers 25I. Further, the channel protective film 25 may have a plurality of the lower oxide layers 25L. In the thin-film transistor 1A, the passivation film 17 may also be provided with the lower oxide layer 17L as illustrated in FIG. 6B.

[Second Embodiment]
[Thin-Film Transistor]

Figure 15:
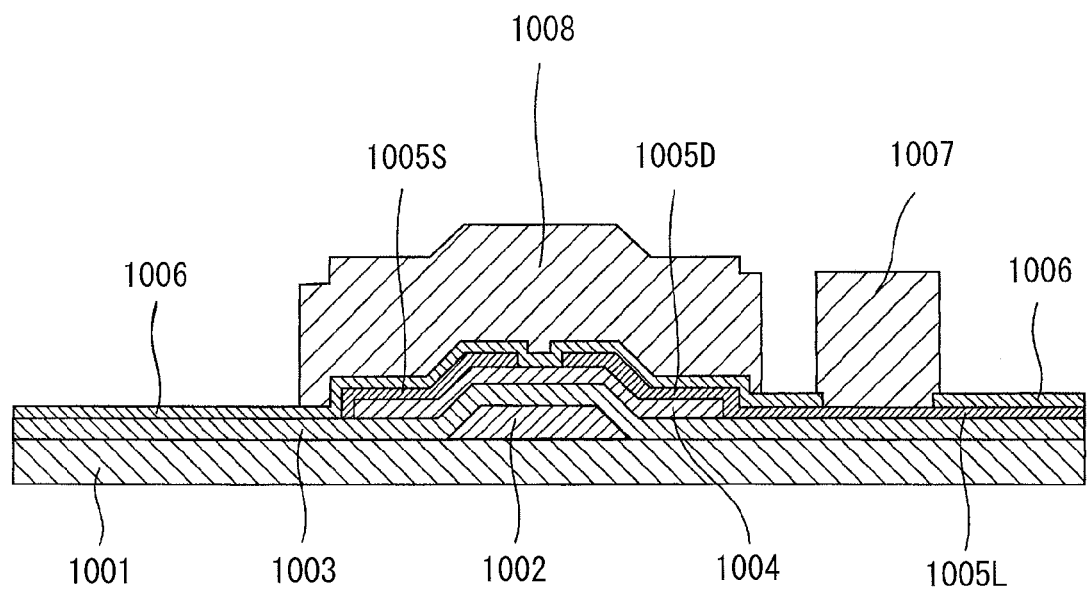
FIG. 15 is a cross-sectional diagram illustrating a thin-film transistor according to a second embodiment of the present application.

FIG. 15 is a cross-sectional diagram illustrating a thin-film transistor 1010 according to a second embodiment of the present application. This thin-film transistor 1010 has a configuration of a bottom-gate type, in which a gate electrode 1002, a gate insulating film 1003, an oxide semiconductor film 1004, a source electrode 1005S as well as a drain electrode 1005D, and a protective film 1006 are laminated on a substrate 1001 in this order, as illustrated in FIG. 15. The oxide semiconductor film 1004 is shaped like an island and provided in a region including the gate electrode 1002 and a part in proximity thereto. The oxide semiconductor film 1004 is provided to have a channel region between the source electrode 1005S and the drain electrode 1005D. The drain electrode 1005D has a wiring 1005L formed by a part extending on the gate insulating film 1003 outside the oxide semiconductor film 1004. On a surface of this wiring 1005L, a low-resistance wiring 1007 electrically connected thereto is provided. The wiring 1005L may be formed by extending the source electrode 1005S, and the low-resistance wiring 1007 is similarly provided on the surface of the wiring 1005L. It is possible to use the wiring 1005L as a pixel electrode. The wiring 1005L may be formed on both sides of the thin-film transistor 1010, by extending both of the source electrode 1005S and the drain electrode 1005D. However, it is preferable to form the wiring 1005L on only one side of the thin-film transistor 1010. When the wiring 1005L is formed on both sides of the thin-film transistor 1010, the low-resistance wiring 1007 may be provided on either only one side or both sides, but it is preferable to provide the low-resistance wiring 1007 on only one side. On the surface of the protective film 1006 above the oxide semiconductor film 1004, i.e. above a channel layer, a light-shielding film 1008 is provided to cover the oxide semiconductor film 1004. The low-resistance wiring 1007 and the light-shielding film 1008 are provided apart from each other, and electrically independent of each other. In other words, the low-resistance wiring 1007 and the light-shielding film 1008 are electrically isolated from each other.

A material of the substrate 1001 is not basically limited, as long as the material has electric insulation, but it is preferable that the material be transparent. Specific examples of the material of the substrate 1001 include a transparent inorganic material and a transparent resin material. When the material is a glass material, for example, quartz glass, borosilicate glass, phosphate glass, soda glass, or the like may be used. Examples of the transparent resin material include polyethylene terephthalate (PET), polyethylene naphthalate (PEN), polybutylene terephthalate (PBT), acetylcellulose, tetraacetylcellulose, polyphenylene sulfide, polycarbonate (PC), polyethylene (PE), polypropylene (PP), polyvinylidene fluoride, brominated phenoxy, amides, polyimides such as polyetherimide, polystyrenes, polyarylates, polysulfones such as polyester sulfone, and polyolefins. The substrate 1001 may be made of only one kind of material, or may be made of more kinds of materials, selected from the group configured of the foregoing materials. As a specific example of the substrate 1001 made of the two or more kinds of materials, a laminated body may be used, but not limited thereto.

The shape of the substrate 1001 is not basically limited, but is preferably a planar shape. Specific examples of the shape of the substrate 1001 include a plate-like shape, a curved-plate-like shape, and a film-like shape.

A material of the gate electrode 1002 is not basically limited, as long as the material has conductivity, but is preferably an inexpensive material with high conductivity. As the material of the gate electrode 1002, specifically, for example, a simple metal or an alloy including at least one selected from the group configured of platinum (Pt), titanium (Ti), aluminum (Al), ruthenium (Ru), molybdenum (Mo), copper (Cu), tungsten (W), and nickel (Ni), or a polycrystal silicon may be used.

The gate electrode 1002 is not basically limited in terms of shape, but preferably has a vertical section shaped like a trapezoid, and more preferably, shaped like an isosceles trapezoid. When the vertical section of the gate electrode 1002 is shaped like a trapezoid or an isosceles trapezoid, the trapezoid preferably has gentle flanks. Then, it is preferable that an angle between each of the flanks and the base of this trapezoid be, for example, about 10 degrees or more and about 80 degrees or less. It is more preferable that this angle be about 20 degrees or more and about 60 degrees or less, and it is still more preferable that this angle be about 30 degrees or more and about 50 degrees or less.

Although the gate electrode 1002 may be either a single layer or a laminate including a plurality of layers, the single layer is preferable. In a case of laminating a plurality of layers, layers of the same material may be laminated, or layers of a plurality of materials may be combined and laminated. The material of the gate electrode 1002 is selected as appropriate from the above-enumerated materials.

A material of the gate insulating film 1003 is not basically limited, as long as the material has electric insulation, but it is preferable to use a material with high electric insulation. Examples of the material of the gate insulating film 1003 include silicon oxide, silicon nitride, aluminum oxide, and aluminum nitride. The gate insulating film 1003 may be a film made of one kind, or made of two or more kinds, selected from the group configured of these examples of the material.

How to provide the gate insulating film 1003 is not basically limited, as long as the gate electrode 1002 and the oxide semiconductor film 1004 are electrically insulated from each other. However, it is preferable that, for instance, the gate insulating film 1003 be provided to cover the gate electrode 1002. Although the gate insulating film 1003 may be a single-layer film or a laminate including a plurality of films, the single-layer film is preferable. In a case of laminating a plurality of films, films of the same material may be laminated, or films of a plurality of materials may be combined and laminated. In this case, the materials are selected as appropriate from those enumerated above as the examples of the material of the gate insulating film 1003.

The gate insulating film 1003 is not basically limited in terms of film thickness, but is preferably as thin as possible. Specifically, the gate insulating film 1003 has a film thickness of, preferably about 50 nm or more and about 1 μm or less; more preferably, about 100 nm or more and about 600 nm or less; and still more preferably, about 200 nm or more and about 400 nm or less. In addition, it is preferable that the film thickness of the gate insulating film 1003 be uniform.

A material of the oxide semiconductor film 1004 is not basically limited, as long as the material is an oxide semiconductor. Here, the oxide semiconductor is a compound containing oxygen and an element such as indium (In), gallium (Ga), zinc (Zn), tin (Sn), and zirconium (Zr). Examples of the oxide semiconductor include an amorphous oxide semiconductor and a crystalline oxide semiconductor. Examples of the amorphous oxide semiconductor include indium gallium zinc oxide (IGZO). Examples of the crystalline oxide semiconductor include zinc oxide (ZnO), indium zinc oxide (IZO®), and indium gallium oxide (IGO).

How to provide the oxide semiconductor film 1004 is not basically limited, as long as the oxide semiconductor film 1004 is provided to have a function as an active layer of the thin-film transistor 1010. It is preferable, however, that the oxide semiconductor film 1004 be provided to be laminated on a surface of the gate insulating film 1003 above the gate electrode 1002. It is also preferable that the oxide semiconductor film 1004 have a laminated structure including an amorphous film and a crystallized film. The source electrode 1005S and the drain electrode 1005D are provided to be in contact with the crystallized film. Specifically, the oxide semiconductor film 1004 has the laminated structure in which the amorphous film and the crystallized film are laminated in this order from the gate electrode 1002 side. This makes it possible to achieve uniform and excellent electrical properties of the thin-film transistor 1010.

The film thickness of the oxide semiconductor film 1004 is not basically limited, but preferably, decided in consideration of oxygen supply by annealing after the formation of the oxide semiconductor film 1004. This film thickness is, for example, preferably about 5 nm or more and about 100 nm or less; more preferably, about 20 nm or more and about 80 nm or less; and still more preferably, about 40 nm or more and about 60 nm or less, but not limited thereto.

The source electrode 1005S and the drain electrode 1005D are not basically limited in terms of material, as long as the material is a transparent conductive oxide, but preferably, the transparent conductive oxide has high conductivity, and more preferably, further has a high degree of light transmission. As the transparent conductive oxide, a transparent conductive oxide semiconductor may be typically used. As the transparent conductive oxide semiconductor, when it is an n-type semiconductor, there may be used, for example, specifically, an oxide in which a base material is zinc oxide (ZnO), indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), molybdenum oxide ($MoO_3$), or the like. $Ga_2O_3$ is preferably $\beta$-$Ga_2O_3$ having a most stable structure. Here, examples of the oxide using ZnO as the base material include AZO, GZO, IZO, and FZO. Further, examples of the oxide using $In_2O_3$ as the base material include ITO and FTO. Furthermore, examples of the oxide using $SnO_2$ as the base material include ATO and FTO. As the transparent conductive oxide semiconductor, when it is a p-type semiconductor, there may be used, for example, specifically, an oxide in which a base material is $CuAlO_2$, LaCuOS, LaCuOSe, $SrCu_2O_2$, NiO, or the like. However, the transparent conductive oxide is limited to none of the above-enumerated examples. The material of each of the source electrode 1005S and the drain electrode 1005D is, preferably, an inexpensive material with high conductivity, for example. The source electrode 1005S and the drain electrode 1005D may be made of one kind of material, or made of two or more kinds of materials, selected from the group configured of those enumerated above as the examples of the transparent conductive oxide. In addition, the source electrode 1005S and the drain electrode 1005D may be made of the same kind of material, or may be made of different kinds of materials. The reasons why the transparent conductive oxide is used as the material of the source electrode 1005S and the drain electrode 1005D are as follows. First of all, use of the transparent conductive oxide makes it possible stabilize the electrical properties of the thin-film transistor 1010. The electrical properties of the thin-film transistor 1010 disadvantageously become unstable when the oxide semiconductor film 1004 comes in contact with a metal easily removing oxygen and a crystal defect is formed by oxygen desorption. Thus, a film made of a transparent conductive oxide containing oxygen is used as the source electrode 1005S and the drain electrode 1005D which will be brought into contact with the oxide semiconductor film 1004. This makes it possible to suppress the oxygen desorption from the oxide semiconductor film 1004, thereby stabilizing the electrical properties of the thin-film transistor 1010. Secondly, it is possible to provide a substantially transparent thin-film transistor by providing the wiring 1005L as follows. The wiring 1005L is provided by forming the source electrode 1005S and/or the drain electrode 1005D in a shape extending on the gate insulating film 1003 outside the oxide semiconductor film 1004, so that the wiring 1005L serves as a pixel electrode.

The source electrode 1005S and the drain electrode 1005D are not basically limited in terms of shape, but are preferably, for example, in the shape of a film. The film forming the source electrode 1005S and the drain electrode 1005D may be a single-layer film, or a laminate including a plurality of films, but the single-layer film is preferable. In a case of laminating a plurality of films, films of the same material may be laminated, or films of a plurality of materials may be combined and laminated. These materials are selected as appropriate from those enumerated above as the examples of the transparent conductive oxide.

Further, the film thickness of each of the source electrode 1005S and the drain electrode 1005D is not basically limited, but is preferably as thin as possible. Specifically, for example, the source electrode and the drain electrode each have a thickness of, preferably, about 1 nm or more and about 200 nm or less; more preferably, about 100 nm or more and about 200 nm or less; and still more preferably, about 150 nm or more and about 200 nm or less, without being limited to these thicknesses. In addition, the thickness of the source electrode and that of the drain electrode may be the same or different, but are preferably the same. As the thicknesses of the source electrode 1005S and the drain electrode 1005D, for example, the thickness may be selected as appropriate from those enumerated above as the examples of the thickness of the source electrode 1005S and the drain electrode 1005D

The protective film 1006 is not basically limited in terms of material, as long as the material is a metal oxide, but is preferably a material with high electric insulation, and more preferably, a stable substance. As the metal oxide, metallic oxynitride may also be used. Specific examples of the metal oxide include aluminum oxide ($Al_2O_3$), titanium oxide ($TiO_2$), zinc oxide (ZnO), indium oxide ($In_2O_3$), tin oxide ($SnO_2$), gallium oxide ($Ga_2O_3$), tellurium oxide ($TeO_2$), germanium oxide ($GeO_2$), cadmium oxide (CdO), tungsten oxide ($WO_3$), and molybdenum oxide ($MoO_3$). $TiO_2$ is preferably of a rutile type which has a most stable structure. $Ga_2O_3$ is preferably $\beta$-$Ga_2O_3$ having a most stable structure. As the metallic oxynitride, specifically, for example, aluminum oxynitride, titanium oxynitride, and the like may be used, although the metal oxide is not limited to these examples. As the material of the protective film 1006, the material may be, for example, selected as appropriate from those enumerated above as the examples of the metal oxide forming the protective film. It is preferable that the protective film 1006 be made of aluminum oxide or titanium oxide, in particular, but not limited thereto.

The protective film 1006 may be basically of any type, as long as the protective film 1006 has a function as the passivation film. The protective film 1006 may be a single-layer film or a laminate including a plurality of films, but the single-layer film is preferable. In a case of laminating a plurality of films, films of the same material may be laminated, or films of a plurality of materials may be combined and laminated, which materials are selected as appropriate from those enumerated above as the examples of the metal oxide.

The film thickness of the protective film 1006 is not basically limited in terms of thickness, but is preferably as thin as possible. Specifically, for example, the protective film has a thickness of, preferably, about 1 nm or more and about 200 nm or less; more preferably, about 100 nm or more and about 200 nm or less; and still more preferably, about 150 nm or more and about 200 nm or less, without being limited to these thicknesses. As the thickness of the protective film 1006, the thickness may be, for example, selected as appropriate from those enumerated above as the examples of the thickness of the protective film. Since the thickness of each of the source electrode 1005S and the drain electrode 1005D is small, the protective film 1006 is allowed to have sufficient coatability even when the film thickness thereof is small. Specifically, even when the protective film 1006 is formed along a device surface, a decline in the coatability in a step region is small, because steps formed by the source electrode 1005S and the drain electrode 1005D are small.

The low-resistance wiring 1007 is not basically limited in terms of material, as long as the material has conductivity. However, it is preferable that the low-resistance wiring 1007 be made of, for example, such a material that the conductivity of the low-resistance wiring 1007 is higher than that of one or both of the source electrode 1005S and the drain electrode 1005D. As the material of the low-resistance wiring 1007, for example, a simple metal, a metal compound, an alloy, or the like may be used. Examples of the simple metal include silver (Ag), copper (Cu), gold (Au), aluminum (Al), magnesium (Mg), tungsten (W), cobalt (Co), zinc (Zn), nickel (Ni), potassium (K), lithium (Li), iron (Fe), platinum (Pt), tin (Sn), chromium (Cr), lead (Pb), titanium (Ti), tantalum (Ta), molybdenum (Mo), vanadium (V), niobium (Nb), hafnium (Hf), zirconium (Zr), ruthenium (Ru), iridium (Ir), and lanthanum (La). Examples of the metal compound include metal oxide, metal carbide, metal nitride, and metallocyanide. Specifically, there may be used, for example, a metal compound of any selected from the group configured of those enumerated above as the examples of the simple metal. As the alloy, an alloy containing two or more elements, for instance, may be used. Examples of the alloy containing two or more elements include alloys each containing two or more selected from the group configured of those enumerated above as the examples of the simple metal.

The low-resistance wiring 1007 is not basically limited, as long as the low-resistance wiring 1007 is provided to be connected electrically to one or both of the source electrode 1005S and the drain electrode 1005D. However, it is preferable that the low-resistance wiring 1007 be provided, for example, to be laminated on one or both of the source electrode 1005S and the drain electrode 1005D. In addition, the low-resistance wiring 1007 is provided, preferably, in a region except for a part above the channel region, and more preferably, in a region as close to the channel region as possible except for the part above the channel region. Then, the low-resistance wiring 1007 is provided, preferably, for example, in a region extending over a distance of about 100 nm or more and about 100 µm or less from an edge of the oxide semiconductor film 1004, the edge being on a side where the wiring 1005L is formed, and the region extending in parallel with the edge. This region extends, more preferably, over a distance of about 750 nm or more and about 100 µm or less, and still more preferably, over a distance of about 1,000 nm or more and about 50 µm or less. The low-resistance wiring 1007, however, is limited to none of these distances.

The low-resistance wiring 1007 is not basically limited in terms of shape, but is preferably shaped like a film, for example. The film forming the low-resistance wiring 1007 may be a single-layer film or a laminate including a plurality of films, but the single-layer film is preferable. In a case of laminating a plurality of films, films of the same material may be laminated, or films of a plurality of materials may be combined and laminated, which are selected as appropriate from those enumerated above as the examples of the material of the low-resistance wiring 1007. When the low-resistance wiring 1007 is the laminate, the laminate preferably has three or more laminated layers, but not limited thereto.

It is preferable that the film thickness of the low-resistance wiring 1007 be large from the viewpoint of securing conductivity, while being small from the viewpoint of configuring the entire device as a thin device. Therefore, there is an optimum range for the film thickness of the low-resistance wiring 1007. The film thickness of the low-resistance wiring 1007 is preferably, for example, about 300 nm or more and about 2 µm or less; more preferably, about 600 nm or more and about 1.5 nm or less; and still more preferably, about 800 nm or more and about 1.2 nm or less, but not limited thereto.

The light-shielding film 1008 is not basically limited in terms of material, as long as the material has a light shielding effect, but the material preferably has conductivity. The material of the light-shielding film 1008 may be selected as appropriate from those enumerated above as the examples of the material of the low-resistance wiring 1007.

The light-shielding film 1008 is not basically limited, as long as the light-shielding film 1008 is provided on the surface of the protective film 1006 above the oxide semiconductor film 1004, thereby blocking the light incident on the oxide semiconductor film 1004. It is preferable, however, that the light-shielding film 1008 be provided on the protective film 1006, to cover the oxide semiconductor film 1004. In addition, it is preferable the light-shielding film 1008 be provided, for example, to be electrically isolated from the low-resistance wiring 1007. Moreover, it is preferable that the light-shielding film 1008 be provided in the same layer as the low-resistance wiring 1007. Specifically, for example, the top surface of an end of the light-shielding film 1008 and the top surface of the low-resistance wiring 1007 are flush with each other.

The light-shielding film 1008 may be a single-layer film or a laminate including a plurality of films, but the laminate including the plurality of films is preferable. In a case of laminating a plurality of films, films of the same material may be laminated, or films of a plurality of materials may be combined and laminated, which are selected as appropriate from those enumerated above as the examples of the material of the low-resistance wiring 1007, for example. When the light-shielding film 1008 is the laminate including the plurality of films, the laminate preferably has three or more laminated layers, but not limited thereto.

It is preferable that the film thickness of the light-shielding film 1008 be large from the viewpoint of securing the light shielding effect, while being small from the viewpoint of configuring the entire device as a thin device. Therefore, there is an optimum range for the film thickness of the light-shielding film 1008. Then, the film thickness of the light-shielding film 1008 is preferably, for example, about 300 nm or more and about 2 µm or less; more preferably, about 600 nm or more and about 1.5 µm or less; and still more preferably, about 800 nm or more and about 1.2 µm or less, but not limited thereto.

In this way, the light-shielding film 1008 is provided on the surface of the protective film 1006 above the oxide semiconductor film 1004, thereby covering the oxide semiconductor film 1004. Therefore, the light shielding effect for the oxide semiconductor film 1004 greatly improves, as compared with an ordinary thin-film transistor. The reason for this is that a shader is formed at a position closer to the oxide semiconductor film 1004, than that in a case where light is intercepted by a pixel electrode in an ordinary thin-film transistor. Another reason is that the light-shielding film 1008 is provided along the shape of the oxide semiconductor film 1004.

The distance between the surface of the oxide semiconductor film 1004 and the light-shielding film 1008 in the present embodiment is, for example, one-tenth the distance between the surface of an oxide semiconductor film and a pixel electrode in an ordinary thin-film transistor. It is conceivable that the light shielding effect for the oxide semiconductor film 1004 greatly improves, because the light-shielding film 1008 is thus formed at the position much closer to the channel region than that of an ordinary pixel electrode.

According to the thin-film transistor of this second embodiment, the following various functions and effects are achievable. In the second embodiment, all the layers in contact with the oxide semiconductor film 1004 are each configured using oxides, and therefore, oxygen desorption from the oxide semiconductor film 1004 towards the source electrode 1005S and the drain electrode 1005D is allowed to be effectively suppressed. Further, oxygen desorption from the source electrode 1005S and the drain electrode 1005D towards the protective film 1006 is also allowed to be effectively suppressed. Furthermore, since the low-resistance wiring 1007 electrically connected to one or both of the source electrode 1005S and the drain electrode 1005D is provided, the conductivity is allowed to be ensured by the low-resistance wiring 1007 even when the film thickness of each of the source electrode 1005S and the drain electrode 1005D is made small. In addition, since the low-resistance wiring 1007 is provided apart from a contact part of the source electrode 1005S and the drain electrode 1005D, a reduction in oxygen desorption in the lower oxide semiconductor film by the low-resistance wiring 1007 is allowed, which enables suppression of deterioration in the thin-film transistor. Moreover, since the film thickness of each of the source electrode 1005S and the drain electrode 1005D is made small, the steps are low, thereby allowing an increase in the coatability even when the protective film 1006 is formed to be thin. In addition, the light-shielding film 1008 is provided on the protective film 1006 above the oxide semiconductor film 1004 so as to cover the oxide semiconductor film 1004, and the protective film 1006 is formed as a thin film along the device surface. Therefore, the distance between the surface of the oxide semiconductor film 1004 and the light-shielding film is smaller than that of a distance between a pixel electrode and a surface of an oxide semiconductor film in an ordinary flattening film. This greatly increases the light shielding effect for the oxide semiconductor film. Further, since the low-resistance wiring 1007 and the light-shielding film 1008 are electrically isolated from each other, a current flow does not adversely affect the protective film 1006, the oxide semiconductor film 1004, and the like. In addition, the wiring 1005L is provided by forming the source electrode 1005S and/or the drain electrode 1005D in the shape extending on the gate insulating film 1003 outside the oxide semiconductor film 1004, and the wiring 1005L is provided as the pixel electrode. Therefore, a substantially transparent thin-film transistor is achievable.

[Method of Manufacturing Thin-Film Transistor]

This thin-film transistor may be manufactured as follows, for example.

FIG. 16A to FIG. 19 are cross-sectional diagrams each illustrating a process of manufacturing the thin-film transistor 1010. First, a metal film that will be the material of the gate electrode 1002 is formed on the surface of the substrate 1001. As a method of forming the metal film, for example, deposition, sputtering, or the like using any of those enumerated above as the examples of the material of the gate electrode 1002 may be used, but not limited thereto.

Figure 16A:
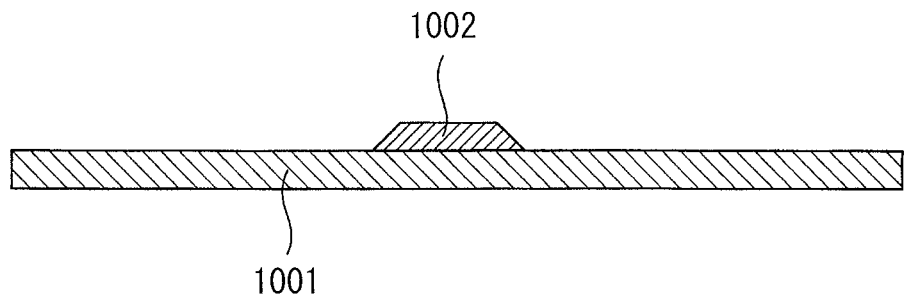
FIGS. 16A to 16C are cross-sectional diagrams illustrating a method of manufacturing the thin-film transistor according to the second embodiment of the present application, in process order.

Next, as illustrated in FIG. 16A, the gate electrode 1002 is formed by patterning the metal film formed on the substrate 1001. A method used as the patterning may be, for example, but not limited to, photolithography or the like.

Figure 16B:
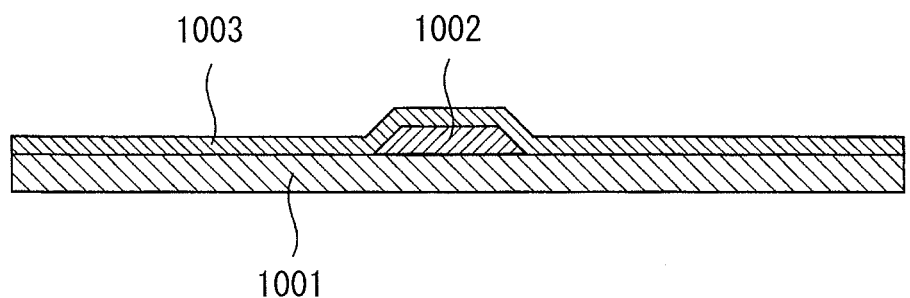

Subsequently, the gate insulating film 1003 is formed on the surface of the gate electrode 1002, as illustrated in FIG. 16B. A method of forming the gate insulating film 1003 may be, for example, but not basically limited to, plasma CVD, sputtering, or the like using any of those enumerated above as the examples of the material of the gate insulating film 1003. Examples of the plasma CVD include a method of forming a silicon nitride film using gas such as silane, ammonia, and nitrogen as source gas, and a method of forming a silicon oxide film using gas such as silane and dinitrogen oxide as source gas. The gate insulating film 1003 may be formed by laminating these films. As the sputtering, it is preferable to use, for example, reactive plasma sputtering. As the reactive plasma sputtering, there may be specifically used, for example, a method of forming a silicon oxide film or a silicon nitride film by performing sputtering through use of oxygen, water vapor, nitrogen, or the like in an electric discharge atmosphere, by using silicon as a sputtering target. Alternatively, there may be used a method of forming an aluminum oxide film or an aluminum nitride film by similarly performing sputtering using aluminum as a sputtering target. The gate insulating film 1003 may be formed by laminating two or more selected from the group configured of the films enumerated above, but not limited thereto.

Figure 16C:
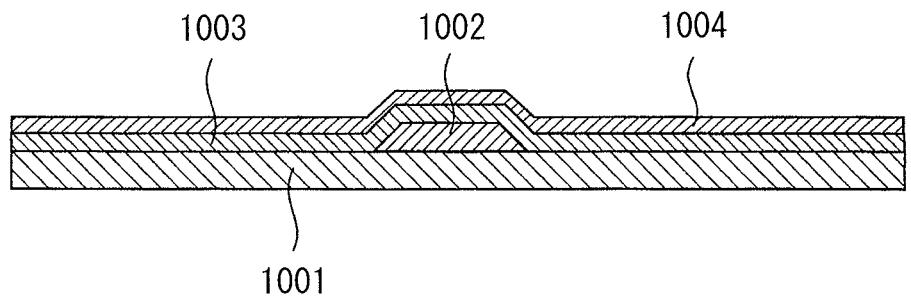

Next, the oxide semiconductor film 1004 is formed on the gate insulating film 1003, as illustrated in FIG. 16C. A method of forming the oxide semiconductor film 1004 may be, for example, but basically not limited to, sputtering, CVD, deposition, or the like using any of those enumerated above as the examples of the material of the oxide semiconductor film 1004.

When the oxide semiconductor film 1004 is configured using, for example, indium gallium zinc oxide (IGZO), it is possible to form the oxide semiconductor film 1004 on the gate insulating film 1003, through plasma arc using mixed gas of argon (Ar) and oxygen, by using DC sputtering in which ceramic of IGZO is targeted. It is to be noted that, before the plasma arc, the mixed gas of argon and oxygen is introduced after air is exhausted until the degree of vacuum in a vacuum case becomes $1 \times 10^{-4}$ Pa.

Alternatively, when the oxide semiconductor film 1004 is configured using, for example, ZnO, it is possible to form the oxide semiconductor film 1004 by RF sputtering using ceramic of ZnO as a target, or by sputtering through use of a DC power source in a gas atmosphere containing argon (Ar) and oxygen by using zinc as a metallic target. In this process, the carrier density in the oxide semiconductor film 1004 that will be the channel is controllable by changing a flow ratio between argon and oxygen in oxide formation.

Figure 17A:
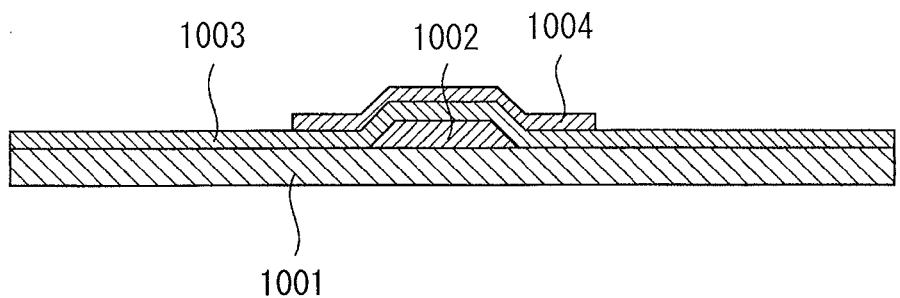
FIGS. 17A to 17C are cross-sectional diagrams illustrating the method of manufacturing the thin-film transistor according to the second embodiment of the present application, in process order.

Next, the oxide semiconductor film 1004 is patterned to have a desired shape as illustrated in FIG. 17A. Although the oxide semiconductor film 1004 is not basically limited in terms of shape, the oxide semiconductor film 1004 is formed to be shaped like an island by patterning, for example, in a region including the gate electrode 1002 and a part in proximity thereto.

The method of patterning the oxide semiconductor film 1004 may be, for example, but not basically limited to, a method of forming the oxide semiconductor film 1004 by patterning through etching after a photolithography process. Further, as the etching, it is preferable to use wet etching, because the oxide semiconductor forming the oxide semiconductor film 1004 easily dissolves in acid, alkali, and the like. However, the etching is not limited to the wet etching, and may be dry etching.

When the oxide semiconductor film 1004 is made of, for example, a crystalline material such as ZnO, In, Ga, Zr, and Sn, in which the ratio of In and Sn is greater than those of other elements, it is preferable to subject the surface of the oxide semiconductor film 1004 to a crystallization annealing treatment, after the oxide semiconductor film 1004 is formed. This treatment makes it possible to improve resistance to an etching solvent.

Figure 17B:
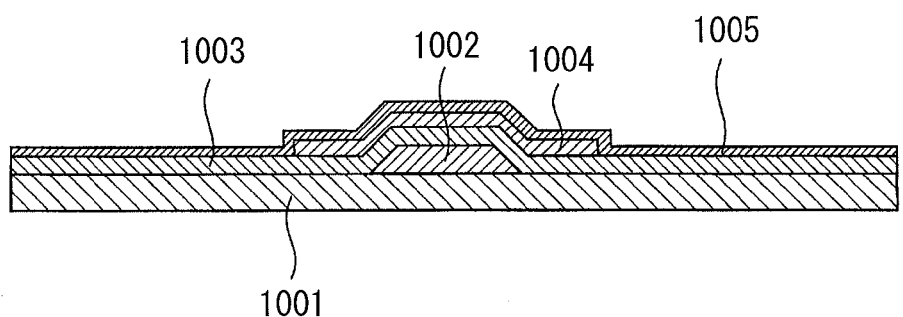

Subsequently, a transparent conductive oxide film 1005 is formed on the oxide semiconductor film 1004 and the gate insulating film 1003, as illustrated in FIG. 17B. The transparent conductive oxide film 1005 is not basically limited in terms of film thickness, but is preferably as thin as possible to reduce steps on the device surface. For instance, any of those enumerated above as the examples of the film thickness of the source electrode 1005S and the drain electrode 1005D may be selected, as appropriate, as the film thickness of the transparent conductive oxide film 1005. The transparent conductive oxide film 1005 may be formed to include either a single layer or a plurality of layers. However, the single-layer is preferable, considering that the transparent conductive oxide film 1005 is formed to be as thin as possible. Although the method of forming the transparent conductive oxide film 1005 is not basically limited, for instance, it is possible to form the transparent conductive oxide film 1005 by sputtering or the like using any of those enumerated above as the examples of the material of the source electrode 1005S and the drain electrode 1005D, for example.

Figure 17C:
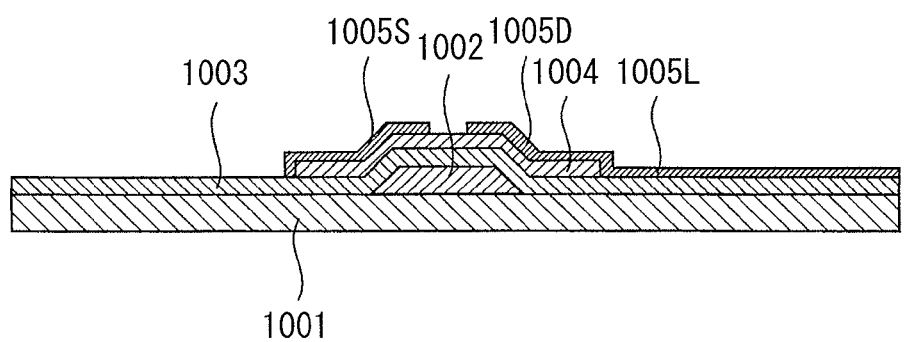

Next, the source electrode 1005S and the drain electrode 1005D are formed as illustrated in FIG. 17C. The source electrode 1005S and the drain electrode 1005D are formed to be apart from each other, by patterning the transparent conductive oxide film 1005. In addition, the drain electrode 1005D is formed to have a part extended on the gate insulating film 1003 outside the oxide semiconductor film 1004. This extended part becomes the wiring 1005L. The wiring 1005L may be formed by extending a part of the source electrode 1005S on the gate insulating film 1003 outside the oxide semiconductor film 1004. The wiring 1005L may be provided on only the source electrode 1005S side, or only the drain electrode 1005D side, or on both of these sides. Although the way of spacing the source electrode 1005S and the drain electrode 1005D is not basically limited, patterning, for example, is performed to provide an opening immediately above the channel region. At this moment, it is preferable that the surface of the oxide semiconductor film 1004 have been subjected to the crystallization annealing treatment. Since the oxide semiconductor film 1004 becomes a crystallized film 1004, it is possible to suppress damage to the oxide semiconductor film 1004 caused by the patterning. The method of patterning for the source electrode 1005S and the drain electrode 1005D may be, for example, but not basically limited to, wet etching, dry etching, or the like. Alternatively, it is possible to form the source electrode 1005S, the drain electrode 1005D, and the wiring 1005L, by forming the transparent conductive oxide film 1005 independently for each thereof on the oxide semiconductor film 1004. In this case, a patterning process is not necessary and thus, there is no occurrence of deterioration in the oxide semiconductor film 1004 in patterning.

Figure 18A:
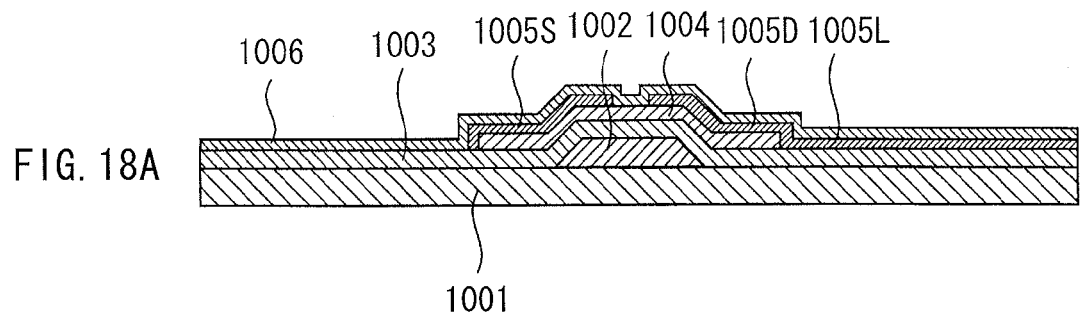
FIGS. 18A to 18C are cross-sectional diagrams illustrating the method of manufacturing the thin-film transistor according to the second embodiment of the present application, in process order.

Subsequently, the protective film 1006 is formed on the entire surface on the side where the source electrode 1005S and the drain electrode 1005D are formed, as illustrated in FIG. 18A. The protective film 1006 prevents hydrogen in the atmosphere from reducing the oxide semiconductor film 1004 during a process and the like. The protective film 1006 also prevents oxygen desorption from the oxide semiconductor film 1004, as well as the source electrode 1005S, the drain electrode 1005D, and the wiring 1005L made of the transparent conductive oxide film 1005, from occurring due to a heat treatment and the like. Typically, it is preferable that the protective film 1006 have a high density for the purpose of preventing transmission of oxygen and hydrogen. Specifically, the density is preferably about $2.5 \text{ g/cm}^3$ or more and about $4.0 \text{ g/cm}^3$ or less, and more preferably, about $3.0 \text{ g/cm}^3$ or more and about $4.0 \text{ g/cm}^3$ or less, for example, but not limited thereto.

The method of forming the protective film 1006 may be, for example, but not basically limited to, a method of forming the protective film 1006 through plasma CVD, sputtering, or the like using any of those enumerated above as the examples of the material of the protective film 1006. When the protective film 1006 is formed by sputtering, for example, the protective film 1006 is formed using a target, in which any of those enumerated above as the examples of the material of the protective film 1006 is the main component, in an atmosphere of argon gas including oxygen, or in an atmosphere of nitrogen gas including oxygen. The target may be one in which an oxide of any of those enumerated above as the examples of the material of the protective film 1006 is contained as the main component, or one in which this oxide to which an impurity is added is contained as the main component. Further, it is preferable that the protective film 1006 be formed by adding an oxygen radical thereto at the time of forming the protective film 1006. The formation of the protective film 1006 is, however, not limited to any of the above specific description.

In this process, it is possible to cover the device surface sufficiently, even when the film thickness of the protective film 1006 is small. This is because the step between the gate insulating film 1003 and the source electrode 1005S as well as the drain electrode 1005D is smaller than those of currently exiting devices. Conceivably, the reason the step is smaller is that each of the source electrode 1005S and the drain electrode 1005D is formed to have the film thickness smaller than that of currently exiting devices. Specifically, for example, in an ordinary device, each of a source electrode equivalent to the source electrode 1005S and a drain electrode equivalent to the drain electrode 1005D has a film thickness of about 0.3 µm or more and about 2 µm or less, which is large. In contrast, the film thickness of each of the source electrode 1005S and the drain electrode 1005D is about 1 nm or more and about 200 nm or less, which is small.

Figure 18B:
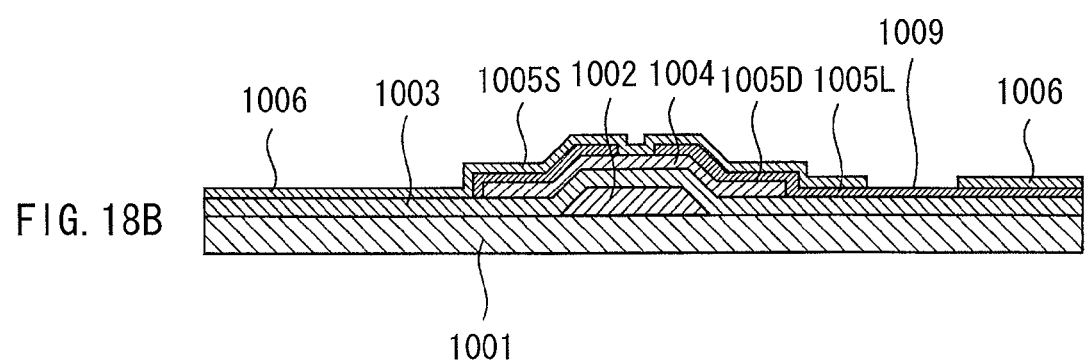

Next, as illustrated in FIG. 18B, a contact hole 1009 which brings the low-resistance wiring 1007 into contact with the wiring 1005L is formed in the protective film 1006 on the wiring 1005L, so that the wiring 1005L is exposed. The contact hole 1009 is formed at, preferably, but not basically limited to, a position as close to the oxide semiconductor film 1004 as possible, as long as this is a position where the oxide semiconductor film 1004 is not damaged by a process of providing the contact hole 1009 and a post process which is a process of patterning a low resistance film 1011. The position where the oxide semiconductor film 1004 is not damaged may be, specifically, for example, a position away from the contact region between the oxide semiconductor film 1004 and the source electrode 1005S as well as the drain electrode 1005D. The reason the low-resistance wiring 1007 is preferably as close to the oxide semiconductor film 1004 as possible is that it is necessary to reduce wiring resistance as much as possible. Then, the position where the contact hole 1009 is provided is, preferably, in a certain region. For instance, this region is preferably at a distance of about 100 nm or more and about 100 µm or less perpendicularly from an edge of the oxide semiconductor film 1004, the edge being on the side where the wiring 1005L is formed, and the region extending in parallel with the edge. More preferably, the region is, for example, at a distance of about 750 nm or more and about 100 μm or less, and still more preferably, at a distance of about 1,000 nm or more and about 50 μm or less. The region, however, is not limited to none of these ranges.

Figure 18C:
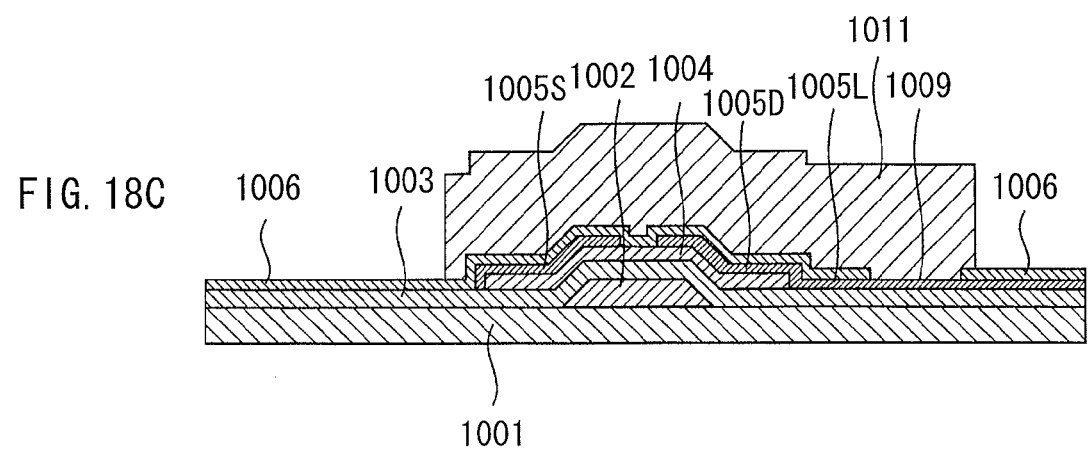

Subsequently, the low resistance film 1011 is formed on the protective film 1006 and on the wiring 1005L in the contact hole 1009, as illustrated in FIG. 18C. The low resistance film 1011 is not basically limited, as long as it is provided to fill the contact hole 1009. However, it is preferable that the low resistance film 1011 be provided on the protective film 1006 above the oxide semiconductor film 1004, so as to cover the entire oxide semiconductor film 1004. In other words, it is preferable that the low resistance film 1011 be uniformly provided over the entire region including the region provided with the oxide semiconductor film 1004 and the region of the contact hole 1009.

The method of forming the low resistance film 1011 is not basically limited. For example, the low resistance film 1011 may be formed through deposition, sputtering, or the like using any of those enumerated above as the examples of the material of the low-resistance wiring 1007. It is preferable, however, to form the low resistance film 1011 by the sputtering. Further, the low resistance film 1011 may be a single layer film or a laminated film. When the laminated film is used, layers may be laminated sequentially by sputtering. The film thickness of the low resistance film 1011 may be, for example, selected as appropriate from those enumerated above as the examples of the film thickness of the low-resistance wiring 1007, but is not basically limited thereto.

Figure 19:
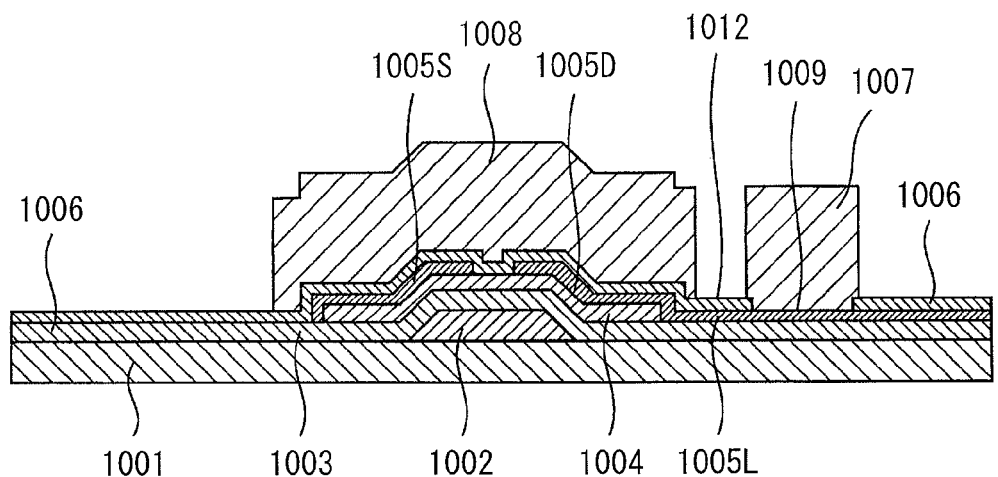
FIG. 19 is a cross-sectional diagram illustrating the method of manufacturing the thin-film transistor according to the second embodiment of the present application, in process order.

Next, as illustrated in FIG. 19, an opening 1012 is formed by removing a part of the low resistance film 1011 by patterning the low resistance film 1011, the part being above a region between the oxide semiconductor film 1004 and the contact hole 1009. As a result, the low-resistance wiring 1007 and the light-shielding film 1008 are formed to be apart from each other. The patterning of the low resistance film 1011 is not basically limited, as long as the light-shielding film 1008 is formed to cover a part above the oxide semiconductor film 1004, and the low-resistance wiring 1007 is formed to be electrically connected to the wiring 1005L. It is preferable, however, that the low-resistance wiring 1007 and the light-shielding film 1008 be electrically independent of each other. In addition, it is preferable that the entire contact hole 1009 be formed to be in contact with the low-resistance wiring 1007.

The method of patterning the low resistance film 1011 may be, for example, but not basically limited to, dry etching using gas plasma, reactive ion etching, or the like. The gas plasma used in the dry etching may be, for instance, chlorine gas, or the like.

When the dry etching using the gas plasma is adopted for patterning in a process similar to this process for a currently-available thin-film transistor, damage is caused to those equivalent to the source electrode 1005S, the drain electrode 1005D, and the like. In the thin-film transistor 1010 according to the present embodiment, however, it is possible to prevent this damage, because the protective film 1006 is formed on the source electrode 1005S, the drain electrode 1005D, and the like, and the region except for the part above the oxide semiconductor film 1004 is patterned.

In this way, the contact hole 1009 is formed in the protective film 1006 after the protective film 1006 is formed, and then the low-resistance wiring 1007 and the light-shielding film 1008 are formed by patterning after the low resistance film 1011 is formed on the protective film 1006. Thus, the light-shielding film 1008 is allowed to be provided in proximity to the oxide semiconductor film 1004. This greatly increases the light shielding effect for the oxide semiconductor film 1004.

EXAMPLE 1

On a plastic film substrate serving as the substrate 1001, a Cu film was formed. As the plastic film substrate, a polyimide film having high heat resistance was used. The Cu film was formed by sputtering. This Cu film was then patterned to become a Cu electrode by being subjected to photolithography, and this was provided as the gate electrode 1002. The Cu electrode, which was the patterned Cu film, was shaped like a column with an isosceles-trapezoid shape in cross section. The Cu electrode had the bottom in contact with the plastic film substrate, and was about 200 nm or more in height.

Next, a $SiO_2$ film was formed on the Cu film and the plastic film substrate. The $SiO_2$ film was formed by sputtering. The $SiO_2$ film was formed on the entire surface of the plastic film substrate so as to cover the Cu film, and this was provided as the gate insulating film 1003. The formed $SiO_2$ film had a film thickness of about 300 nm.

Subsequently, an IGZO film was formed on the entire surface of the $SiO_2$ film. The IGZO film was formed by DC sputtering in which ceramic of IGZO was a target. The DC sputtering was performed through the following processes. First, the target made of ceramic of IGZO and a device substrate where the film was to be formed were placed in a container, while being spaced apart from each other. Next, air was exhausted until the degree of vacuum in the container was $1 \times 10^{-4}$ Pa or less. Subsequently, mixed gas of argon and oxygen was introduced in the container. Then, the IGZO film was formed on the $SiO_2$ film on the device substrate, through plasma arc with the mixed gas of argon and oxygen, by using the ceramic of IGZO as the target. The IGZO film formed by this process had a film thickness of about 50 nm.

Next, after the IGZO film was subjected to photolithography, the IGZO film was formed by wet etching, to be shaped like an island in a region including the Cu electrode and a part in proximity thereto, and this was provided as the oxide semiconductor film 1004. The surface of the IGZO film was subjected to a crystallization annealing treatment at 300° C., and therefore the oxide semiconductor film 1004 crystallized as a whole was obtained.

Subsequently, an ITO film was formed on the IGZO film. The ITO film was formed to extend on the IGZO film and the $SiO_2$ film outside the IGZO film.

Next, this ITO film was patterned by wet etching, so that the source electrode 1005S and the drain electrode 1005D were formed. In the patterning, a space was formed in the ITO film on an apical surface of the IGZO film by etching. Further, a part on one side of the ITO film, the part extending on the $SiO_2$ film outside the IGZO film, was removed by etching. In this way, two ITO films apart from each other were formed on the IGZO film. Of these ITO films, one formed only on the IGZO film was provided as the source electrode 1005S, and the other was provided as the drain electrode 1005D. A part of the ITO film, the part being formed to extend on the $SiO_2$ film outside the IGZO film, was provided as an ITO wiring. The source electrode 1005S, the drain electrode 1005D, and the ITO wiring each had a film thickness of about 100 nm.

Next, an $Al_2O_3$ film was formed on the entire device surface on the side where the ITO film was formed.

Subsequently, a contact hole was formed in the $Al_2O_3$ film formed on the ITO wiring, so that the ITO wiring was exposed. The contact hole was formed in a region at a position about 15 μm perpendicularly away from an edge of the IGZO film, the region having a width of about 10 µm and extending from the position in parallel with the edge. The contact hole was formed by wet etching.

Next, a metal film was formed on the $Al_2O_3$ film, so as to cover the contact hole and a part above the IGZO film uniformly. The metal film was formed by laminating three layers of a Ti film, an Al film, and a Ti film in this order. The metal film was formed by laminating the layers sequentially by sputtering. The metal film as a whole had a film thickness of about 600 nm, and the Ti film, the Al film, and the Ti film had film thicknesses of about 50 nm, about 500 nm, and about 50 nm, respectively.

Subsequently, the formed metal film was patterned to separate a light-shielding film and a low-resistance wiring electrically. The light-shielding film was formed to be capable of shielding the IGZO film from light coming from outside or light coming from a panel. On the other hand, the low-resistance wiring was formed to fill the entire contact hole. Dry etching using chlorine was used for the patterning of the metal film. Thus, a desired thin-film transistor was manufactured.

According to the method of manufacturing the thin-film transistor in this second embodiment, the source electrode 10055 and the drain electrode 1005D made of the transparent conductive oxide film 1005 are each formed to have a small film thickness. Therefore, the step formed next to the gate insulating film 1003 is allowed to be reduced. Thus, in the case where the protective film 1006 is formed on the entire device surface, it is possible to cover and protect the device effectively even when the film thickness of the protective film 1006 is small. In addition, the low-resistance wiring 1007 is formed by providing the contact hole after the formation of the protective film 1006. Thus, the protective film 1006 is allowed to be formed as a thin film and an improvement in the conductivity of the wiring 1005L is enabled, as compared with a currently-available device in which a film equivalent to the protective film 1006 is formed after a wiring equivalent to the low-resistance wiring 1007 is formed. Moreover, since the contact hole is formed at the position away from the contact region between the channel and the source electrode 10055 as well as the drain electrode 1005D, the contact hole is allowed to be formed without affecting the oxide semiconductor film 1004. Further, the low-resistance wiring 1007 and the light-shielding film 1008 are formed after the low resistance film 1011 is formed on the protective film 1006. Therefore, the protective film 1006 effectively protects the oxide semiconductor film 1004, when the low-resistance wiring 1007 and the light-shielding film 1008 are formed through patterning using dry etching or the like. This allows the low-resistance wiring 1007 and the light-shielding film 1008 to be patterned by the etching, without affecting the oxide semiconductor film 1004. Furthermore, since the protective film 1006 is provided below the light-shielding film 1008, the oxide semiconductor film 1004 is not affected even when plasma, a laser, and the like are used in leaving a space between the low-resistance wiring 1007 and the light-shielding film 1008.

[Third Embodiment]
[Thin-Film Transistor]

Now, a third embodiment is described. This third embodiment is equivalent to the second embodiment, except that a channel protective film is further provided on the oxide semiconductor film 1004 of the thin-film transistor 1010 in the second embodiment.

Figure 20:
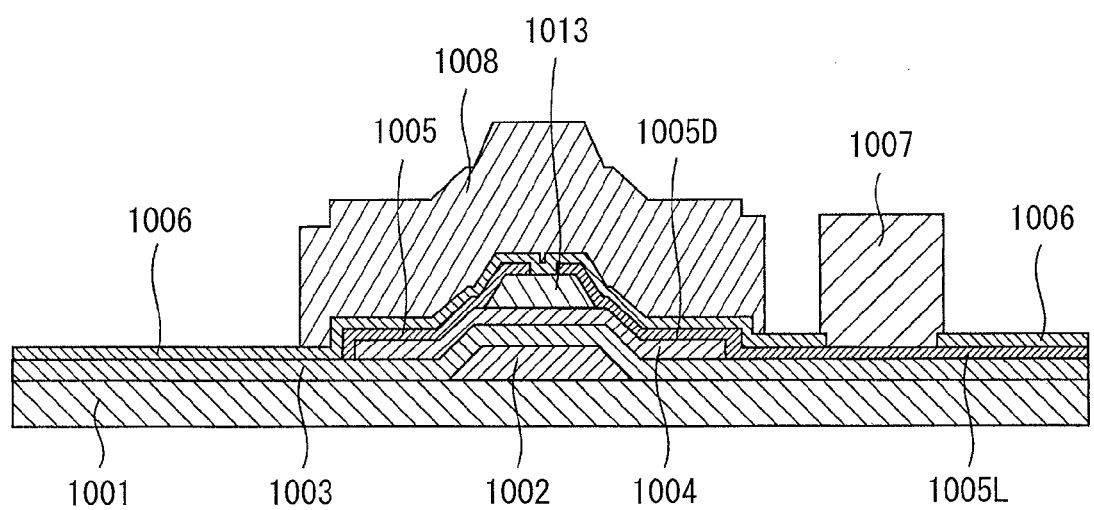
FIG. 20 is a cross-sectional diagram illustrating a thin-film transistor according to a third embodiment of the present application.

FIG. 20 is a cross-sectional diagram illustrating a thin-film transistor according to the third embodiment. As illustrated in FIG. 20, a channel protective film 1013 is provided between the oxide semiconductor film 1004 and the source electrode 1005S as well as the drain electrode 1005D. The source electrode 1005S and the drain electrode 1005D are provided on the channel protective film 1013 and the oxide semiconductor film 1004, so as to form a channel region.

The channel protective film 1013 is not basically limited in terms of material, as long as a material having electric insulation is used, but it is preferable to use, for example, a stable material with low reactivity. Examples of the material forming the channel protective film 1013 include silicon oxide, silicon nitride, aluminum oxide, and titanium oxide.

The channel protective film 1013 may be provided in any form, as long as the channel region is protected thereby, but preferably, for example, the channel protective film 1013 is as thin as possible. Further, the channel protective film 1013 may be a single-layer film or a laminate including a plurality of films, but the single layer is preferable. In a case of laminating a plurality of films, films of the same material may be laminated, or films of a plurality of materials may be combined and laminated, which are selected as appropriate from those enumerated above as the examples of the material of the channel protective film 1013.

The channel protective film 1013 has, specifically, for example, a film thickness of, preferably, about 5 nm or more and about 200 nm or less; more preferably, about 10 nm or more and about 100 nm or less; and still more preferably, about 20 nm or more and about 80 nm or less. However, the film thickness of the channel protective film 1013 is not limited to these ranges.

The channel protective film 1013 is not basically limited in terms of shape, but is preferably shaped to have, for example, an inclined side face, and more preferably shaped like a column tapered up towards the top surface. Specifically, for example, the channel protective film 1013 may be shaped like a column with an isosceles trapezoid shape in cross section. In the channel protective film 1013, the angle of side-face inclination is preferably, for example, about 20 degrees or more and about 80 degrees or less; more preferably, about 30 degrees or more and about 60 degrees or less; and still more preferably, about 40 degrees or more and about 50 degrees or less. Except for this point, the thin-film transistor according to the third embodiment is similar to that according to the second embodiment.

According to the thin-film transistor of the third embodiment, while advantages similar to those of the thin-film transistor in the second embodiment are provided, the channel protective film 1013 is further provided between the oxide semiconductor film 1004 and the source electrode 1005S as well as the drain electrode 1005D and thus, the channel region is protected by the channel protective film 1013. In addition, since the protective film 1006 is provided on the channel protective film 1013 in a space part between the source electrode 1005S and the drain electrode 1005D, suppression of deterioration in the thin-film transistor is allowed, when, in particular, the protective film 1006 is an oxide. This is because oxygen desorption from the channel protective film 1013 and the oxide semiconductor film 1004 is allowed to be suppressed, as compared with a case where the light-shielding film 1008 is directly provided on the channel protective film 1013.

[Method of Manufacturing Thin-Film Transistor]

This thin-film transistor may be manufactured as follows, for example.

FIG. 21A to FIG. 23B are cross-sectional diagrams each illustrating a process of manufacturing the thin-film transistor 1010. First, a metal film that will become the material of the gate electrode 1002 is formed on the surface of the substrate 1001. The method of forming the metal film may be, for example, but not limited to, a method of formation through deposition, sputtering, or the like using any of those enumerated above as the examples of the material of the gate electrode 1002.

Figure 21A:
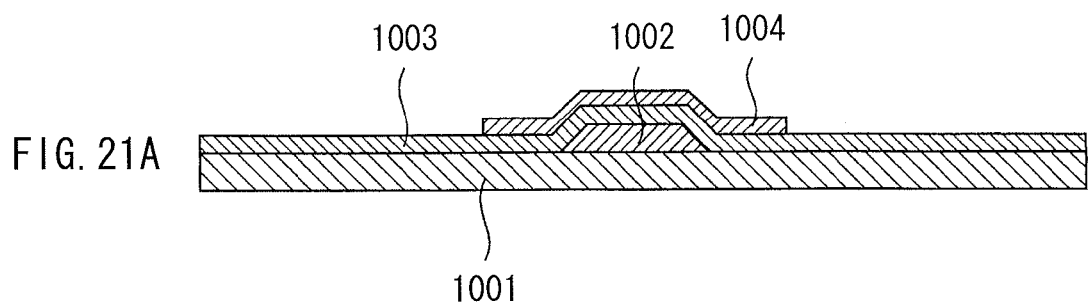
FIGS. 21A to 21C are cross-sectional diagrams illustrating a method of manufacturing the thin-film transistor according to the third embodiment of the present application, in process order.

Next, after the gate electrode 1002 is formed on the substrate 1001, the gate insulating film 1003 is formed on the surface of the gate electrode 1002 as illustrated in FIG. 21A. Subsequently, the oxide semiconductor film 1004 is formed on the gate insulating film 1003. These processes are performed in a manner similar to those in the second embodiment.

Figure 21B:
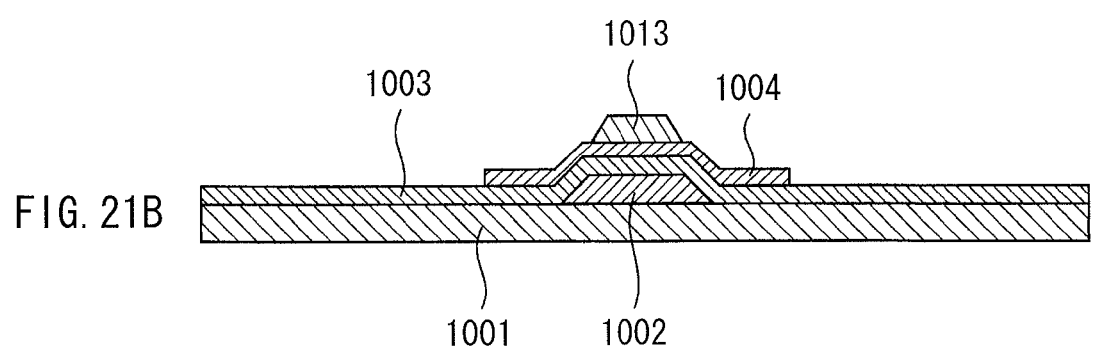

Next, the channel protective film 1013 is formed on the oxide semiconductor film 1004 as illustrated in FIG. 21B. Although the method of forming the channel protective film 1013 is not basically limited, the channel protective film 1013 is formed, for example, by deposition, sputtering, CVD, or the like using any of those enumerated above as the examples of the material of the channel protective film 1013.

The channel protective film 1013 is then patterned to be in a desired shape. The channel protective film 1013 is not basically limited in terms of shape, but, for example, any of those described above as the examples of the shape of the channel protective film 1013 may be appropriately selected.

The method of patterning the channel protective film 1013 may be, for example, but not basically limited to, a method using patterning by performing etching after a photolithography process.

Figure 21C:
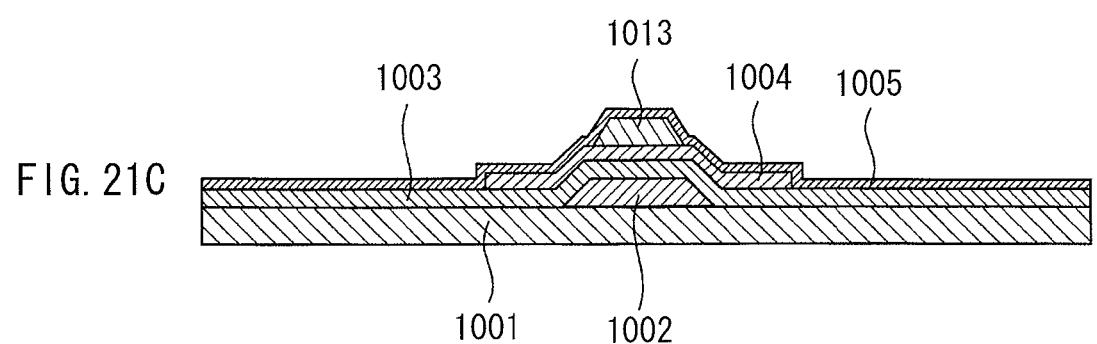

Next, the transparent conductive oxide film 1005 is formed on the channel protective film 1013 and the gate insulating film 1003, as illustrated in FIG. 21C.

Figure 22A:
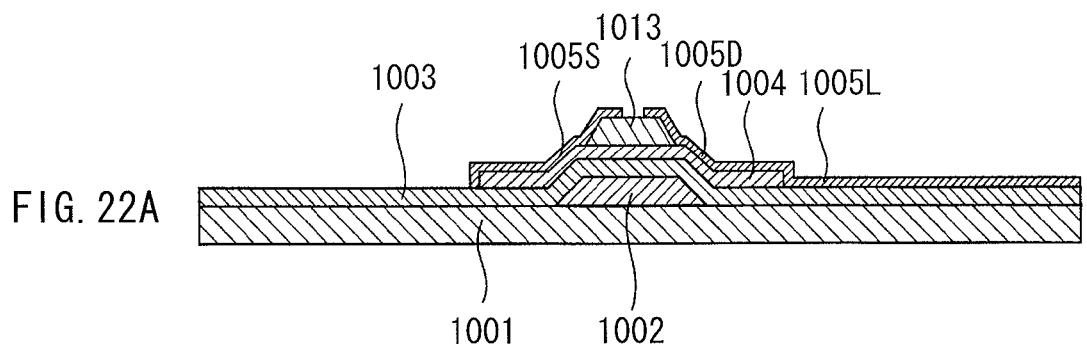
FIGS. 22A to 22C are cross-sectional diagrams illustrating the method of manufacturing the thin-film transistor according to the third embodiment of the present application, in process order.
Figure 22B:
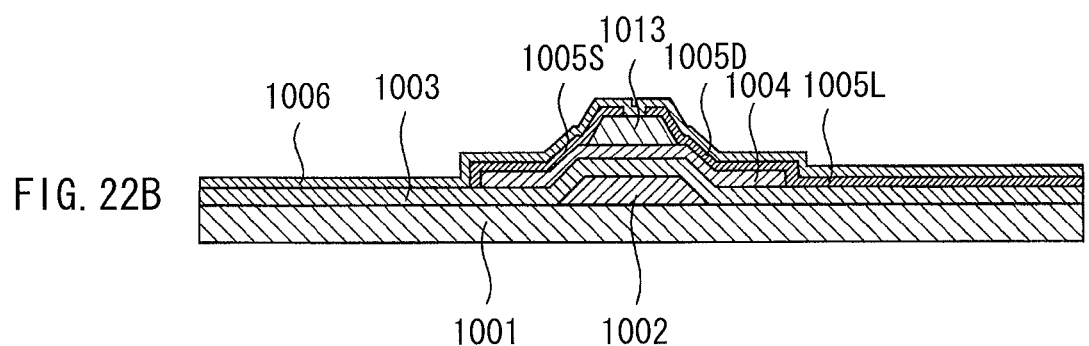

The transparent conductive oxide film 1005 is then patterned to form the source electrode 1005S, the drain electrode 1005D, and the wiring 1005L, as illustrated in FIG. 22A. The source electrode 1005S and the drain electrode 1005D are formed be apart from each other, through the patterning of the transparent conductive oxide film 1005. The drain electrode 1005D is formed to have a part extended on the gate insulating film 1003 outside the oxide semiconductor film 1004. This extended part becomes the wiring 1005L. The wiring 1005L may be formed by extending a part of the source electrode 1005S on the gate insulating film 1003 outside the oxide semiconductor film 1004. Alternatively, the wiring 1005L may be provided on only the source electrode 1005S side, or on only the drain electrode 1005D side, or on both of these sides. The method of leaving a space between the source electrode 1005S and the drain electrode 1005D is not basically limited, but, for example, the patterning is performed to provide an opening immediately above the channel region. At this moment, the channel protective film 1013 serves as an etching stopper, thereby making it possible to prevent the oxide semiconductor film 1004 from being damaged by the patterning. Next, as illustrated in FIG. 22B, the protective film 1006 is formed on the entire surface of the device, on the side where the source electrode 1005S and the drain electrode 1005D are formed. The protective film 1006 prevents hydrogen in the atmosphere from reducing the oxide semiconductor film 1004 during a process and the like. The protective film 1006 also prevents oxygen desorption from the oxide semiconductor film 1004, as well as the source electrode 1005S, the drain electrode 1005D, and the wiring 1005L which are made of the transparent conductive oxide film 1005, from occurring due to a heat treatment and the like. Typically, it is preferable that the protective film 1006 have a high density for the purpose of preventing transmission of oxygen and hydrogen. Specifically, the density is preferably about 2.5 g/cm$^3$ or more and about 4.0 g/cm$^3$ or less, and more preferably, about 3.0 g/cm$^3$ or more and about 4.0 g/cm$^3$ or less, for example, but not limited thereto.

The method of forming the protective film 1006 may be, for example, but not basically limited to, a method through plasma CVD, sputtering, or the like using any of those enumerated above as the examples of the material of the protective film 1006. When the protective film 1006 is formed by sputtering, for example, the protective film 1006 is formed using a target in which any of those enumerated above as the examples of the material of the protective film 1006 is contained as the main component, in an atmosphere of argon gas containing oxygen, or in an atmosphere of nitrogen gas containing oxygen. The target may be one in which the main component is an oxide of any of those enumerated above as the examples of the material of the protective film 1006, or one in which the main component is this oxide to which an impurity is added, but not limited thereto.

In this process, it is possible to cover the device surface sufficiently, even when the film thickness of the protective film 1006 is small. This is because the step between the gate insulating film 1003 and the source electrode 1005S as well as the drain electrode 1005D is smaller than those of currently exiting devices. Conceivably, the reason the step is reduced is that the film thickness of each of the source electrode 1005S and the drain electrode 1005D is formed to be smaller than those of currently exiting devices. Specifically, for example, in an ordinary device, the film thickness of each of a source electrode equivalent to the source electrode 1005S and a drain electrode equivalent to the drain electrode 1005D is about 0.3 μm or more and about 2 μm or less, which is large. In contrast, the film thickness of each of the source electrode 1005S and the drain electrode 1005D is about 1 nm or more and about 200 nm or less, which is small.

Figure 22C:
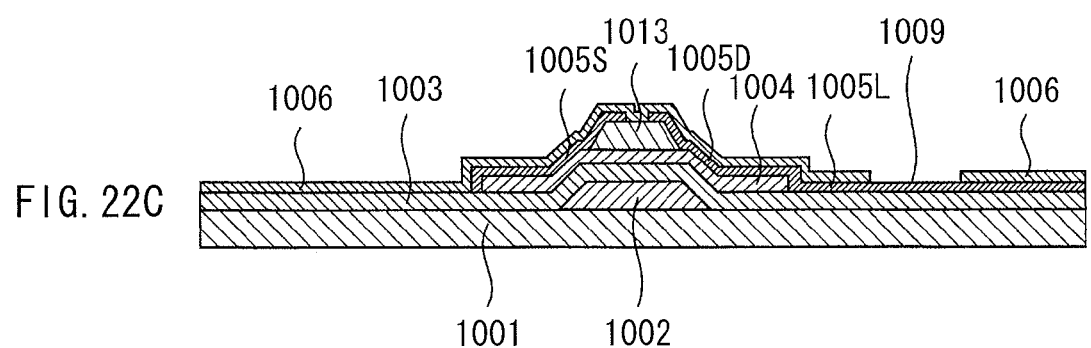

Next, as illustrated in FIG. FIG. 22C, the contact hole 1009 which brings the low-resistance wiring 1007 into contact with the wiring 1005L is formed in the protective film 1006 on the wiring 1005L, so that the wiring 1005L is exposed. The contact hole 1009 is formed at, preferably, but not basically limited to, a position as close to the oxide semiconductor film 1004 as possible, as long as this is a position where the oxide semiconductor film 1004 is not damaged by a process of providing the contact hole 1009 and a post process which is a process of patterning the low resistance film 1011. The position where the oxide semiconductor film 1004 is not damaged may be, specifically, for example, a position away from the contact region between the oxide semiconductor film 1004 and the source electrode 1005S as well as the drain electrode 1005D. The reason the low-resistance wiring 1007 is preferably as close to the oxide semiconductor film 1004 as possible is that it is necessary to reduce wiring resistance as much as possible. Then, the position where the contact hole 1009 is provided is, preferably, in a certain region. For instance, this region is preferably at a distance of about 100 nm or more and about 100 μm or less perpendicularly from an edge of the oxide semiconductor film 1004, the edge being on the side where the wiring 1005L is formed, and the region extending in parallel with the edge. More preferably, the region is, for example, at a distance of about 750 nm or more and about 100 μm or less, and still more preferably, at a distance of about 1,000 nm or more and about 50 μm or less. The region, however, is not limited to none of these ranges.

Figure 23A:
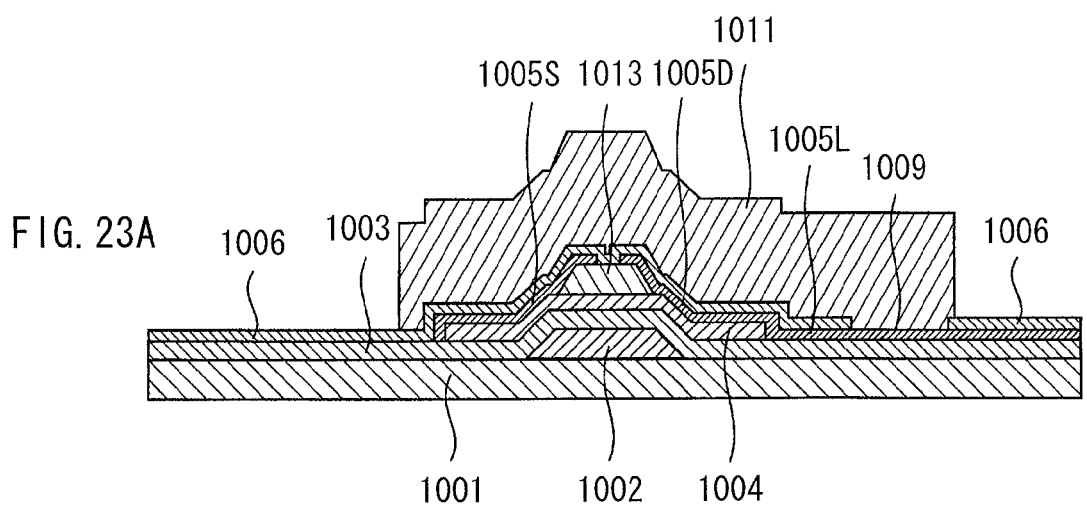
FIGS. 23A and 23B are cross-sectional diagrams illustrating the method of manufacturing the thin-film transistor according to the third embodiment of the present application, in process order.

Subsequently, the low resistance film 1011 is formed on the protective film 1006 and the wiring 1005L in the contact hole 1009, as illustrated in FIG. 23A. The low resistance film 1011 is not basically limited, as long as it is provided to fill the contact hole 1009. However, it is preferable that the low resistance film 1011 be provided on the protective film 1006 above the oxide semiconductor film 1004, so as to cover the entire oxide semiconductor film 1004. In other words, it is preferable that the low resistance film 1011 be uniformly provided over the entire region including the region provided with the oxide semiconductor film 1004 and the region of the contact hole 1009.

The method of forming the low resistance film 1011 is not basically limited. For example, the low resistance film 1011 may be formed through deposition, sputtering, or the like using any of those enumerated above as the examples of the material of the low-resistance wiring 1007. It is preferable, however, to form the low resistance film 1011 by the sputtering. Further, the low resistance film 1011 may be a single layer film or a laminated film. When the laminated film is used, layers may be sequentially laminated by sputtering. The film thickness of the low resistance film 1011 is not basically limited, but may be selected as appropriate, for example, from those enumerated above as the examples of the film thickness of the low-resistance wiring 1007.

Figure 23B:
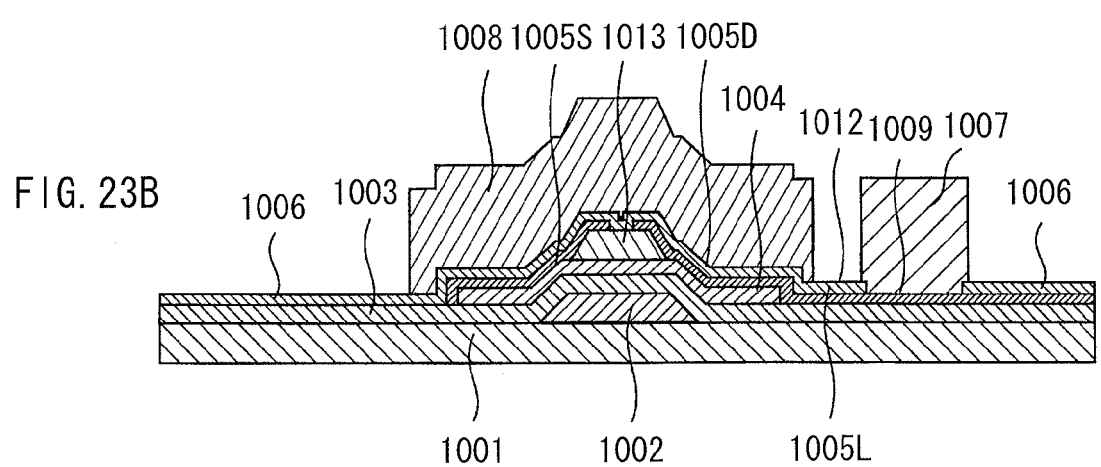

Next, as illustrated in FIG. 23B, the opening 1012 is formed by patterning a part of the low resistance film 1011 provided above a region between the oxide semiconductor film 1004 and the contact hole 1009, so that the low-resistance wiring 1007 and the light-shielding film 1008 are formed to be apart from each other. The patterning of the low resistance film 1011 is not basically limited, as long as the light-shielding film 1008 is formed to cover the part above the oxide semiconductor film 1004, and the low-resistance wiring 1007 is formed to be electrically connected to the wiring 1005L. It is preferable that the patterning of the low resistance film 1011 be performed to allow the low-resistance wiring 1007 and the light-shielding film 1008 to be electrically independent of each other. In addition, it is preferable that the entire surface of the contact hole 1009 be formed to contact the low-resistance wiring 1007.

The method of patterning the low resistance film 1011 may be, for example, but not basically limited to, dry etching using gas plasma, reactive ion etching, or the like. The gas plasma used in the dry etching may be, for instance, chlorine gas. The method of manufacturing the thin-film transistor in the third embodiment is otherwise similar to that in the second embodiment.

EXAMPLE 2

In a manner similar to the Example 1, a Cu electrode, a SiO$_2$ film, and an IGZO film were formed on a plastic film substrate.

Next, a SiO$_2$ film was formed on the entire surface on the IGZO film. The SiO$_2$ film formed on the IGZO film was then subjected to wet etching after being subjected to photolithography, so that the channel protective film 1013 was formed to be shaped like an island covering only an apical surface of the IGZO film. The formed channel protective film 1013 was shaped like an isosceles trapezoid in vertical cross section, and had a film thickness of about 50 nm.

Next, by being subjected to wet etching following photolithography, the IGZO film was formed to have a shape like an island in a region including the Cu electrode and a part in proximity thereto. This resultant IGZO film was provided as the oxide semiconductor film 1004.

Subsequently, an ITO film was formed on the channel protective film 1013 and the IGZO film. The ITO film was formed to extend on the channel protective film 1013, on the IGZO film, and on the SiO$_2$ film outside the IGZO film.

This ITO film was then patterned by wet etching, so that the source electrode 1005S and the drain electrode 1005D were formed. In this patterning, the ITO film on an apical surface of the channel protective film 1013 was divided by etching, and further, a part on one side of the ITO film extending on the outside SiO$_2$ film outside the IGZO film was removed by etching. In this way, two ITO films electrically independent of each other were formed. Of these ITO films, one formed only on the IGZO film was provided as the source electrode 1005S, and the other was provided as the drain electrode 1005D. A part of the ITO film, the part being formed to extend on the SiO$_2$ film outside the IGZO film, was provided as the ITO wiring. The source electrode 1005S, the drain electrode 1005D, and the ITO wiring thus formed each had a film thickness of about 100 nm. A desired thin-film transistor was manufactured otherwise in a manner similar to the Example 2.

COMPARATIVE EXAMPLE

In a manner similar to the Example 1, each of a Cu electrode, a SiO$_2$ film, and an IGZO film was formed on a plastic film substrate. In this process, a crystallization annealing treatment was not applied to the IGZO film.

Next, an ITO film was formed on the IGZO film.

This ITO film was then patterned by wet etching, so that a source electrode and a drain electrode were formed. In this patterning, the ITO film on an apical surface of the IGZO film was divided by etching. Thus, two ITO films spaced apart from each other were formed. Of these ITO films, one formed only on the IGZO film was provided as the source electrode, and the other was provided as the drain electrode. The source electrode and the drain electrode thus formed each had a film thickness of about 100 nm.

Next, a flattening film was provided by forming an epoxy resin film over the entire device surface on the side where the ITO film was formed, so as to fill irregularities of the device. The thickness of the thickest part of the formed epoxy resin film was about 600 nm.

Subsequently, a contact hole was formed in the epoxy resin film formed on the ITO wiring, so that the drain electrode was exposed. The contact hole was formed at a position above the IGZO film, to extend in an extending direction of the IGZO film. The contact hole was formed by dry etching. The contact hole was formed in a region at a position about 15 μm perpendicularly away from an edge of the IGZO film, the edge being on the side where the ITO wiring was formed, and the region having a width of about 10 μm and extending in parallel with the edge of the IGZO film.

Next, a metal film was provided over the entire epoxy resin film, so as to uniformly cover a part above the IGZO film and completely fill the contact hole. This metal film was provided to serve as a pixel electrode. The metal film was formed by sputtering. The metal film as a whole had a film thickness of about 900 nm. In this way, an intended thin-film transistor was manufactured.

Figure 24:
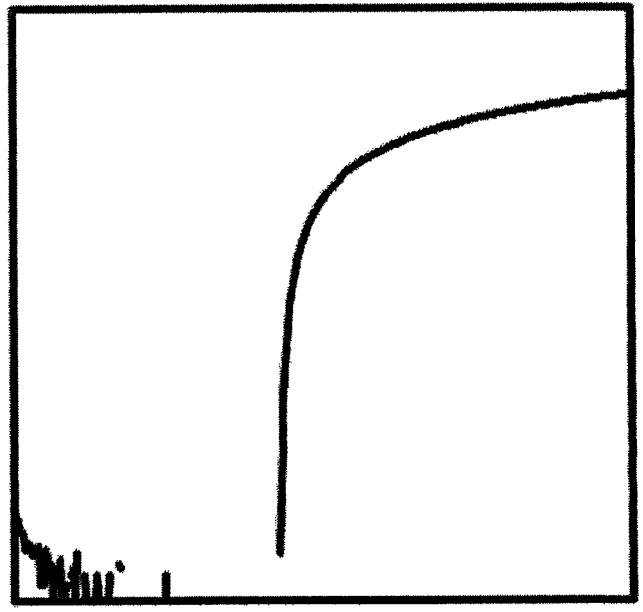
FIG. 24 is a schematic diagram illustrating Vg-Id characteristics of a thin-film transistor according to Example 3 of the present application.
Figure 25:
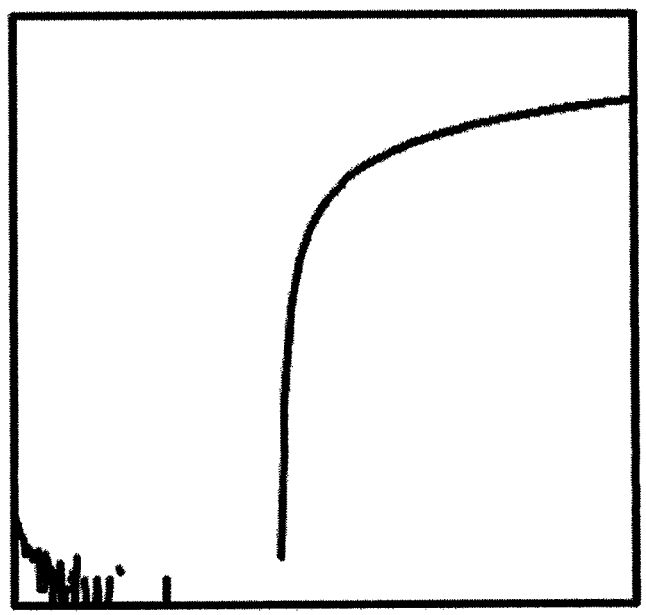
FIG. 25 is a schematic diagram illustrating Vg-Id characteristics of a thin-film transistor according to a comparative example of the present application.

FIG. 24 is a diagram illustrating Vg-Id characteristics of the thin-film transistor of the Example 2. Further, FIG. 25 is a diagram illustrating Vg-Id characteristics of the thin-film transistor of a comparative example. A drain voltage Vd was assumed to be 10V in both examples.

When a comparison is made between the Vg-Id characteristics of the comparative example and that of the Example 2, the Vg-Id characteristics of the Example 2 has steeper subthreshold characteristics than that of the comparative example, as illustrated in FIG. 24 and FIG. 25. In other words, a subthreshold coefficient is smaller and transconductance is higher in the Example 2 than those in the comparative example. In addition, an ON-OFF ratio of a drain current Id in the Example 2 is of nine digits, whereas that in the comparative example is of six digits. Thus, it is found that the ON-OFF ratio of the drain current Id in the Example 2 is greater. As a result, it is made clear that the Example 2 exhibits much superior transfer characteristics to those of the comparative example, and it is demonstrated that the Example 2 is greatly improved in performance, as compared with the comparative example which is a thin-film transistor having an ordinary configuration.

The reason for this is, conceivably, that the low-resistance wiring was provided in the contact region between the IGZO film and the drain electrode in the comparative example, whereas the low-resistance wiring was provided on the ITO wiring away from the contact region between the IGZO film and the drain electrode in the Example 2.

When the low-resistance wiring which is a metal comes in contact with the ITO film, oxygen in the ITO film scatters in the low-resistance wiring, thereby destabilizing the conduction characteristics, as described above.

At this moment, in the comparative example, since the IGZO film is provided under the drain electrode having the low-resistance wiring, the drain electrode destabilized by the oxygen desorption further removes the oxygen from the IGZO film serving as a primary layer. Therefore, conceivably, a variation in the properties of the IGZO film has occurred, thereby further destabilizing the conduction characteristics, which have appeared in the transfer characteristics of the comparative example.

On the other hand, in the Example 3, the ITO wiring provided with the low-resistance wiring is interposed between the gate electrode made of $SiO_2$ which is an oxide and the $Al_2O_3$ film which is also an oxide. Further, since the low-resistance wiring and the light-shielding film are provided apart from each other, the low-resistance wiring is provided at a position away from the contact region between the IGZO film and the drain electrode. Therefore, even when oxygen desorption from the ITO wiring occurs, oxygen is supplied from layers such as the $Al_2O_3$ film which is an oxide and is provided on the side closer to the low-resistance wiring side than the IGZO film. As a result, an influence on the IGZO film is conceivably reduced.

In addition, the low resistance film is provided on the $Al_2O_3$ film, and the low-resistance wiring and the light-shielding film are formed by dividing the low resistance film. Thus, it is possible to reduce the influence on the IGZO film, even when plasma, a laser, and the like are used in dividing the low resistance film.

Further, the light-shielding film in the Example 2 is provided at a position about 200 nm above from the oxide semiconductor film, whereas the pixel electrode in the comparative example is provided at a position about 600 nm above from the oxide semiconductor film. Therefore, the light shielding effect for the oxide semiconductor film is higher in the Example 2 that in the comparative example. As a result, degradation in characteristics due to light receiving in the Example 2 is less than that in the comparative example. Thus, conceivably, the Example 2 demonstrated the transfer characteristics superior to those of the comparative example. The thin-film transistor of the Example 1 having a similar configuration except having the channel protective film 1013 produces similar effects.

According to the method of manufacturing the thin-film transistor of the third embodiment, the channel protective film 1013 is further provided on the oxide semiconductor film of the thin-film transistor in the second embodiment. Therefore, in the third embodiment, while advantages similar to those of the thin-film transistor in the second embodiment are provided, the channel protective film 1013 effectively protects the oxide semiconductor film when the transparent conductive oxide film is patterned by wet etching or the like. Thus, a reduction in deterioration of the oxide semiconductor film is allowed.

APPLICATION EXAMPLE 1

Figure 7:
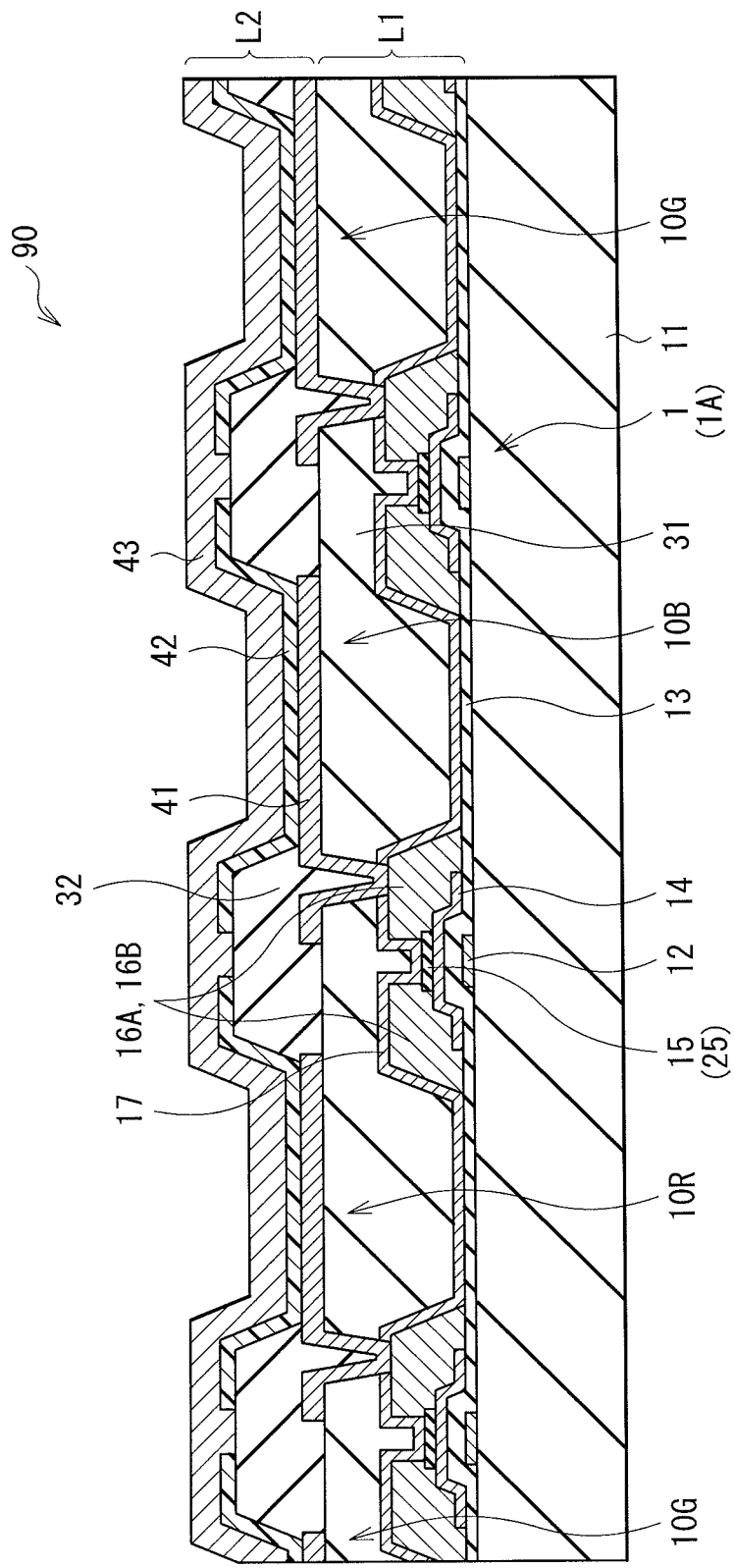
FIG. 7 is a diagram illustrating a cross-sectional configuration of a display unit according to an application example 1.

FIG. 7 illustrates a cross-sectional configuration of a display unit (a display unit 90) that includes the thin-film transistor 1 (or the thin-film transistor 1A) or the thin-film transistor according to each of the second and third embodiments, as a drive device. The display unit 90 is of a self-luminous type, and has a plurality of organic light-emitting devices 10R, 10G, and 10B. In the display unit 90, a pixel-driving-circuit formed layer L1, a light-emitting-device formed layer L2 including the organic light-emitting devices 10R, 10G, and 10B, and a counter substrate (not illustrated) are provided in this order on the substrate 11. The display unit 90 is of a top-emission type, in which light is extracted from the counter substrate side, and the thin-film transistor 1 is included in the pixel-driving-circuit formed layer L1.

Figure 8:
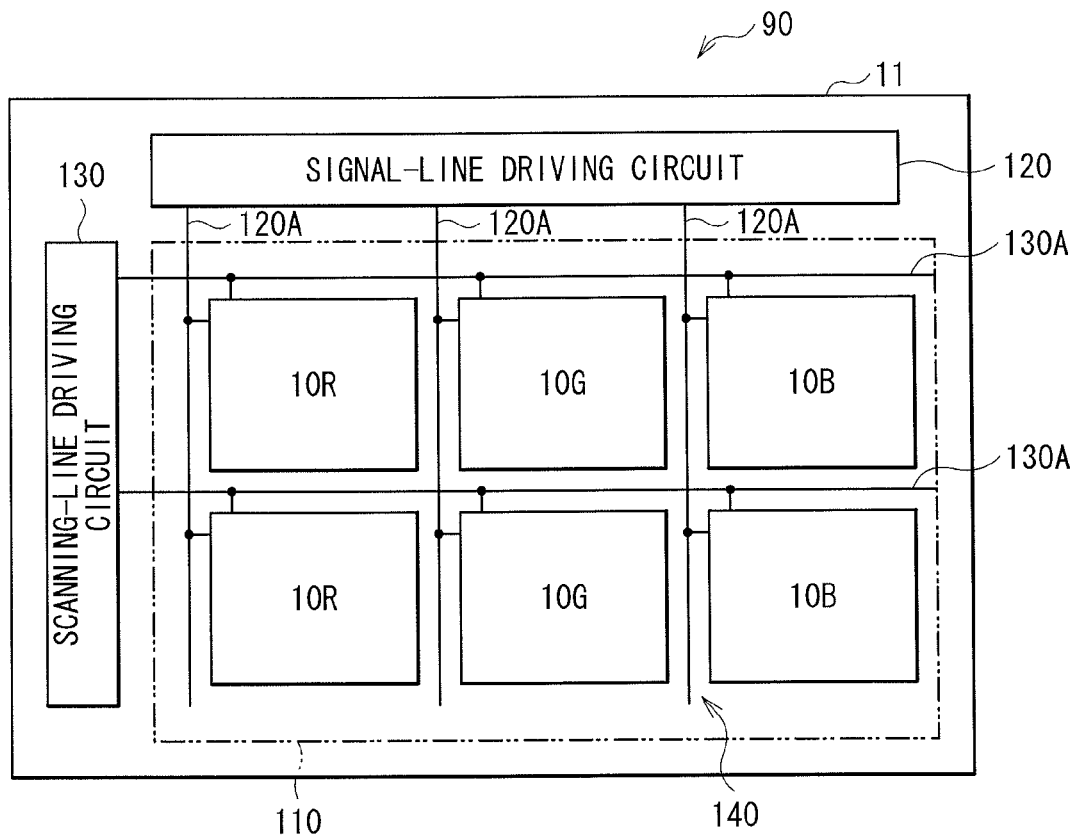
FIG. 8 is a diagram illustrating an overall configuration of the display unit illustrated in FIG. 7.

FIG. 8 illustrates an overall configuration of the display unit 90. The display unit 90 has a display region 110 on the substrate 11, and is used as an extra-thin organic light-emitting color display unit or the like. Provided around the display region 110 on the substrate 11 are, for example, a signal-line driving circuit 120 and a scanning-line driving circuit 130 which are drivers for image display.

In the display region 110, a plurality of the organic light-emitting devices 10R, 10G, and 10B are two-dimensionally arranged in a matrix, and a pixel driving circuit 140 used to drive these light-emitting devices are formed. In the pixel driving circuit 140, a plurality of signal lines 120A are arranged in a column direction, and a plurality of scanning lines 130A are arranged in a row direction. Each of the organic light-emitting devices 10R, 10G, and 10B is provided to correspond to an intersection of each of the signal lines 120A and each of the scanning lines 130A. Each of the signal lines 120A is connected to the signal-line driving circuit 120, and each of the scanning lines 130A is connected to the scanning-line driving circuit 130.

The signal-line driving circuit 120 supplies a signal voltage to any of the selected organic light-emitting devices 10R, 10G, and 10B through the signal line 120A. The signal voltage is of an image signal according to luminance information supplied from a signal supply source (not illustrated). To each of the signal lines 120A, a signal voltage supplied from the signal-line driving circuit 120 is applied.

The scanning-line driving circuit 130 is configured to include components such as a shift register that sequentially shifts (transfers) a start pulse in synchronization with an inputted clock pulse. The scanning-line driving circuit 130 performs scanning of the organic light-emitting devices 10R, 10G, and 10B row by row, when image signals are written into the organic light-emitting devices 10R, 10G, and 10B. The scanning-line driving circuit 130 sequentially supplies a scanning signal to each of the scanning lines 130A.

Figure 9:
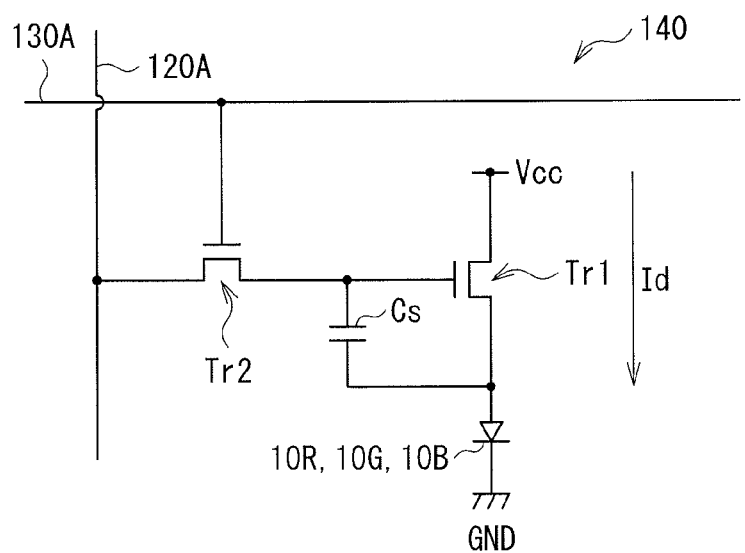
FIG. 9 is a circuit diagram illustrating an example of a pixel driving circuit illustrated in FIG. 8.

The pixel driving circuit 140 is provided in a layer between the substrate 11 and the organic light-emitting devices 10R, 10G, and 10B, i.e. the pixel driving circuit 140 is provided in the pixel-driving-circuit formed layer L1. As illustrated in FIG. 9, the pixel driving circuit 140 is an active-type drive circuit, and includes: a drive transistor Tr1 and a write transistor Tr2 either one or both of which is made of the thin-film transistor 1; a retention capacitor Cs provided between these transistors; and the organic light-emitting devices 10R, 10G, and 10B.

Now, configurations of components such as the pixel-driving-circuit formed layer L1 and the light-emitting-device formed layer L2 is described in detail, with reference to FIG. 7 again.

The thin-film transistor 1 (the drive transistor Tr1 and the write transistor Tr2) of the pixel driving circuit 140 is formed in the pixel-driving-circuit formed layer L1, and further, the signal line 120A and the scanning line 130A are also embedded therein. Specifically, the thin-film transistor 1 and a flattening layer 31 are formed on the substrate 11 in this order. The flattening layer 31 is provided to flatten mainly a surface of the pixel-driving-circuit formed layer L1, and is formed of, for example, an insulating resin material such as polyimide.

The light-emitting-device formed layer L2 is provided with the organic light-emitting devices 10R, 10G, and 10B, a device separating film 32, and a sealing layer (not illustrated) covering them. In each of the organic light-emitting devices 10R, 10G, and 10B, a first electrode 41 serving as an anode electrode, an organic layer 42 including a luminous layer, and a second electrode 43 serving as a cathode electrode are laminated in this order from the substrate 11 side. The organic layer 42 has, for example, a hole injection layer, a hole transport layer, the luminous layer, and an electron transport layer laminated in this order from the first electrode 41 side. The luminous layer may be provided for each device (FIG. 7), or provided to be common to the devices (not illustrated). The layers except for the luminous layer may be provided as necessary. The device separating film 32 is made of an insulating material, and separates each of the organic light-emitting devices 10R, 10G, and 10B for every device. The device separating film 32 is provided to define a light emission region of each of the organic light-emitting devices 10R, 10G, and 10B.

The display unit 90 is applicable to display units of electronic apparatuses in all fields, which display externally-inputted image signals or internally-generated image signals as still or moving images. The electronic apparatuses include, for example, television receivers, digital cameras, laptop computers, portable terminals such as portable telephones, video cameras, and the like.

APPLICATION EXAMPLE 2

Figure 10:
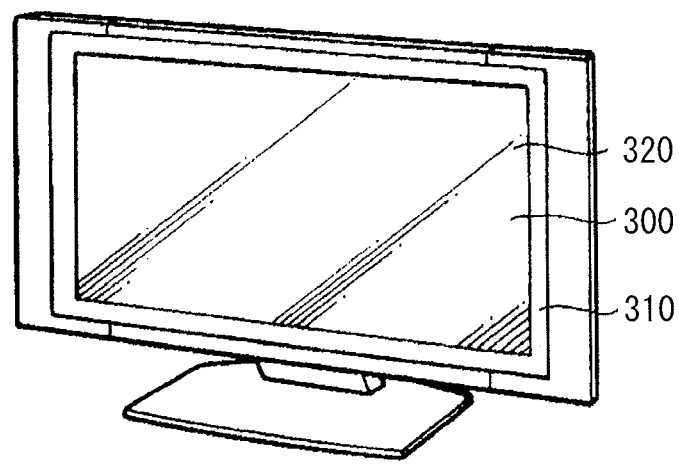
FIG. 10 is a perspective diagram illustrating an appearance of an application example 2.

FIG. 10 illustrates an appearance of a television receiver. This television receiver has, for example, an image-display screen section 300 that includes a front panel 310 and a filter glass 320. The image-display screen section 330 is configured using the display unit 90.

APPLICATION EXAMPLE 3

Figure 11A:
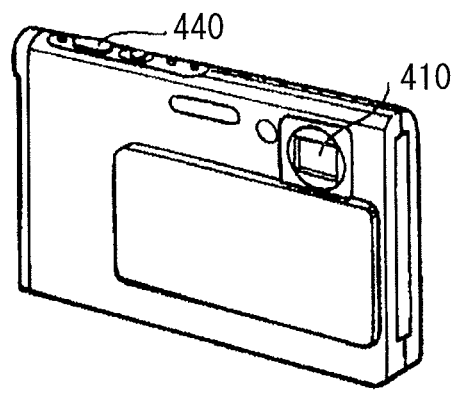
FIGS. 11A and 11B are perspective diagrams of an appearance of an application example 3 viewed from front and back, respectively.
Figure 11B:
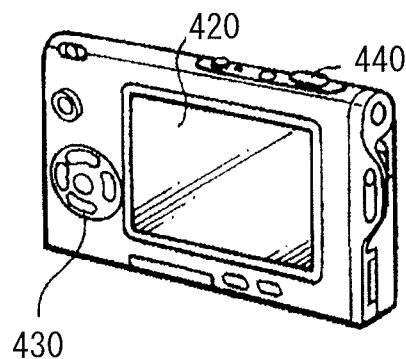

FIGS. 11A and 11B each illustrate an appearance of a digital still camera. This digital still camera includes, for example, a flash emitting section 410, a display section 420, a menu switch 430, and a shutter release 440. The display section 420 is configured using the display unit 90.

APPLICATION EXAMPLE 4

Figure 12:
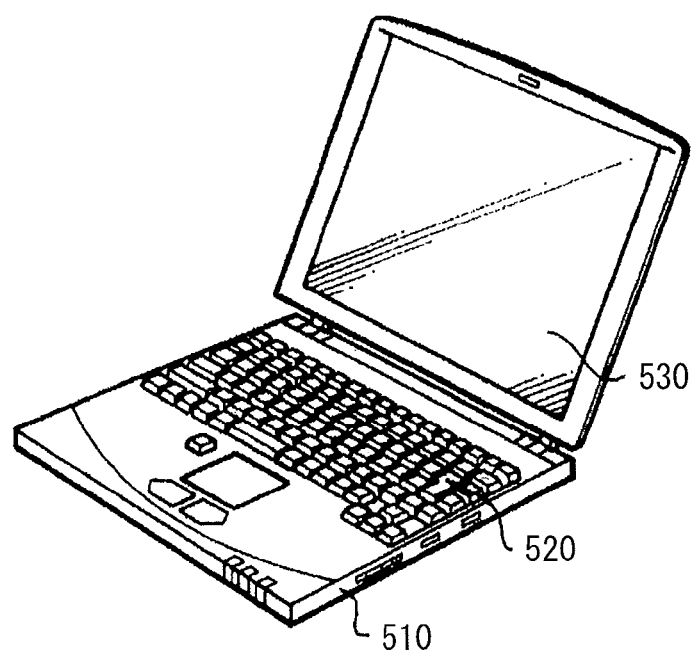
FIG. 12 is a perspective diagram illustrating an appearance of an application example 4.

FIG. 12 illustrates an appearance of a laptop computer. This laptop computer includes, for example, a main body section 510, a keyboard 520 provided to enter characters and the like, and a display section 530 displaying an image. The display section 530 is configured using the display unit 90.

APPLICATION EXAMPLE 5

Figure 13:
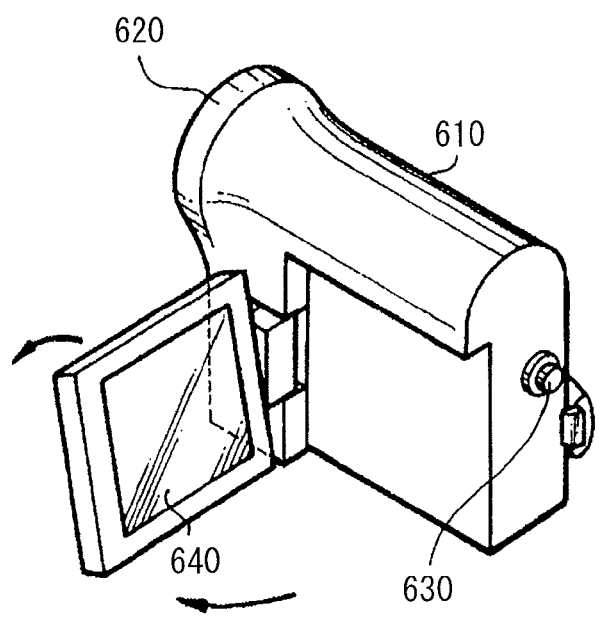
FIG. 13 is a perspective diagram illustrating an appearance of an application example 5.
Figure 14:
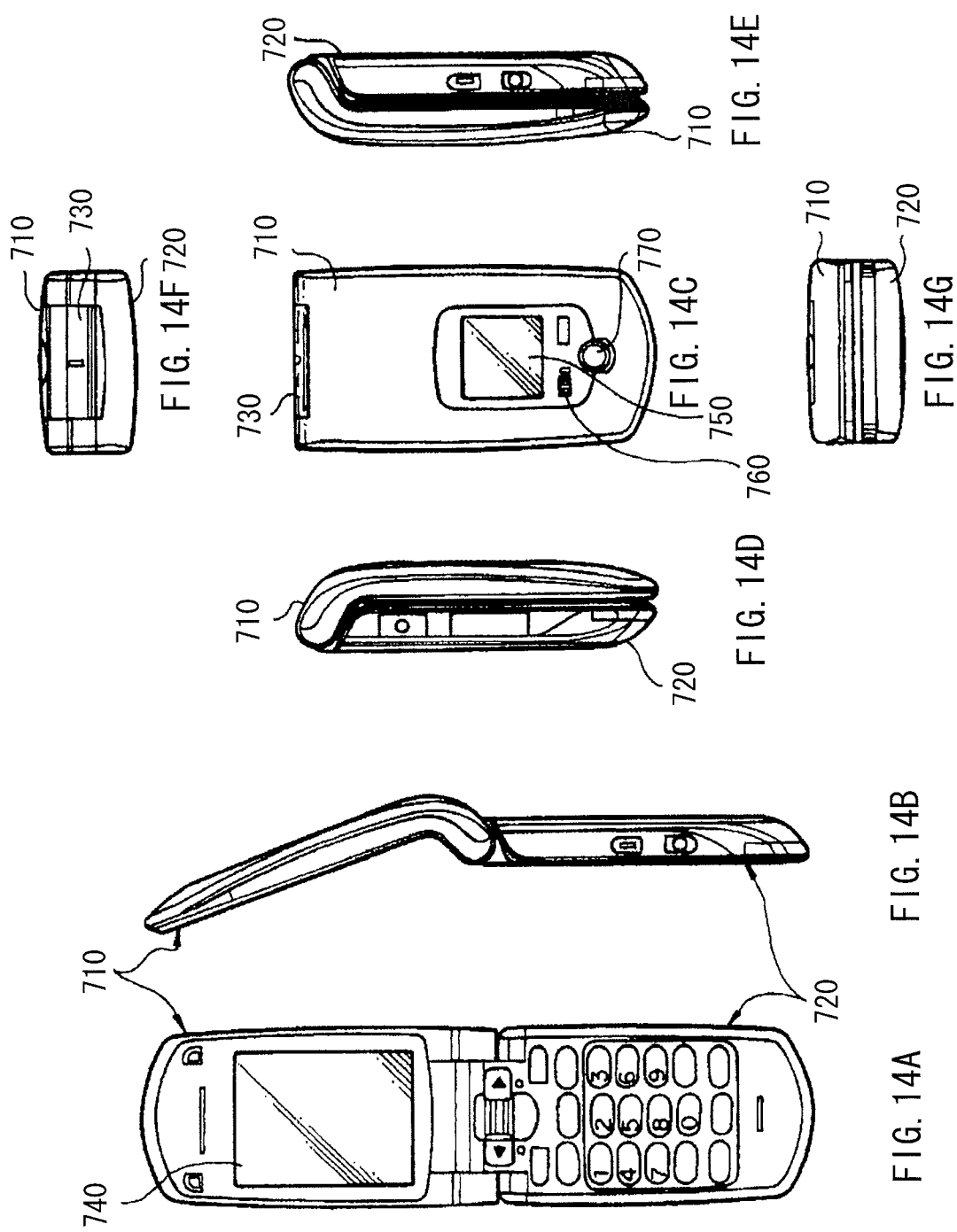
FIGS. 14A to 14G are views of an application example 6, namely, a front view in an open state, a side view in the open state, a front view in a closed state, a left-side view, a right-side view, a top view, and a bottom view, respectively.

FIG. 13 illustrates an appearance of a video camera. This video camera includes, for example, a main body section 610, a lens 620 disposed on a front face of this main body section 610 to shoot an image of a subject, a start/stop switch 630 used in shooting, and a display section 640. The display section 640 is configured using the display unit 90.

APPLICATION EXAMPLE 6

FIGS. 14A to 14G each illustrate an appearance of a portable telephone. This portable telephone is, for example, a unit in which an upper housing 710 and a lower housing 720 are connected by a coupling section (a hinge section) 730, and includes a display 740, a sub-display 750, a picture light 760, and a camera 770. The display 740 or the sub-display 750 is configured using the display unit 90.

APPLICATION EXAMPLE 7

Figure 26A:
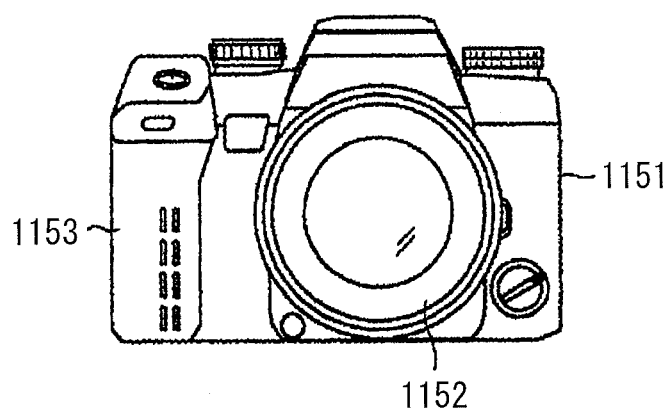
FIGS. 26A and 26B are perspective diagrams each illustrating a digital single-lens reflex camera of an application example 7 to which the display unit is applied.
Figure 26B:
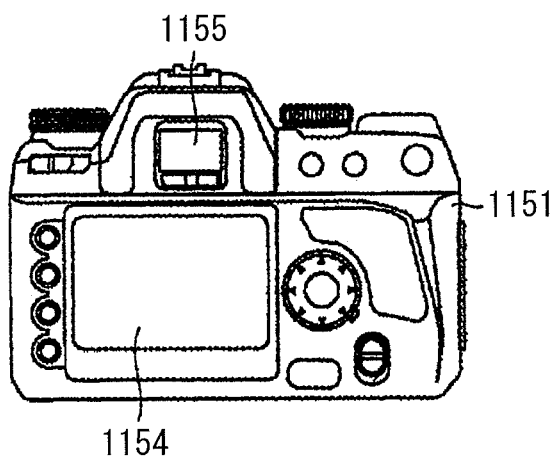

FIGS. 26A and 26B each illustrate an appearance of a digital single-lens reflex camera to which the display unit 90 is applied. FIG. 26A is a front view, and FIG. 26B is a rear view. This digital single-lens reflex camera includes components such as a camera main body section 1151, an image-taking lens unit 1152, a grip section 1153, a monitor 1154, and an electronic view finder 1155. The digital single-lens reflex camera is manufactured using the display unit 90 as the electronic view finder 1155.

APPLICATION EXAMPLE 8

Figure 27:
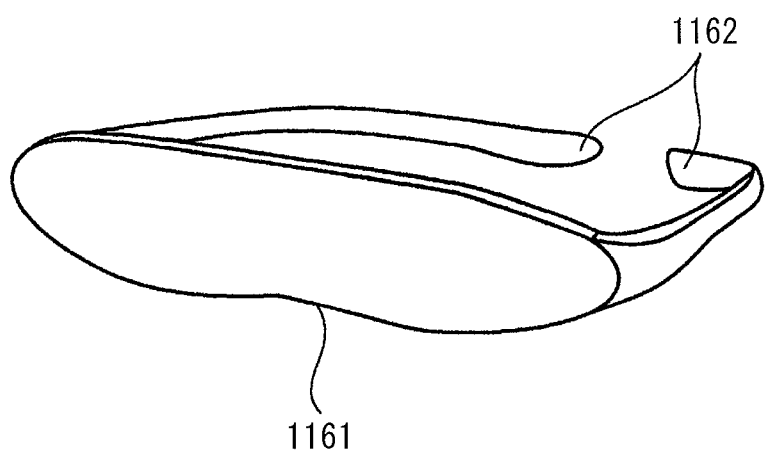
FIG. 27 is a perspective diagram illustrating a head-mounted display of an application example 8 to which the display unit is applied.

FIG. 27 is a perspective diagram illustrating a head-mounted display to which this display unit 90 is applied. This head-mounted display has, for example, components such as a display section 1161 and ear-hung sections 1162. The head-mounted display is manufactured using the display unit 90 as the display section 1161.

The present application has been described with reference to the embodiments and the modification, but is not limited thereto and may be variously modified. For example, the material and thickness of each layer, or the film formation methods and film formation conditions described in the embodiments and the like are not limited. Alternatively, other materials and thicknesses, or other film formation methods and film formation conditions may be adopted.

Further, for example, in the embodiments and the like, the configuration of each of the thin-film transistors 1 and 1A have been specifically described, but each of the thin-film transistors 1 and 1A may further include other layers.

It is to be noted that the present application may be configured as follows.

(1) A thin-film transistor including:
a gate electrode;
an oxide semiconductor film having a channel region that faces the gate electrode; and
a protective film covering at least the channel region and containing an aluminum lower oxide ($Al_xO_y$, where $0 < Y/X < 3/2$) that absorbs light.

(2) The thin-film transistor according to (1), wherein the aluminum lower oxide absorbs visible light.

(3) The thin-film transistor according to (1) or (2), further including a pair of source-drain electrodes electrically connected to the oxide semiconductor film,
wherein the protective film includes a first protective film and a second protective film in this order from the oxide semiconductor film side, and
the second protective film covers the channel region and the source-drain electrodes.

(4) The thin-film transistor according to (3), wherein the aluminum lower oxide is contained in one of the first protective film and the second protective film.

(5) The thin-film transistor according to any one of (1) to (4), wherein the protective film has a laminated structure including a lower oxide layer and an insulating layer, the lower oxide layer being made of the aluminum lower oxide, and the insulating layer being made of a material other than the aluminum lower oxide.

(6) The thin-film transistor according to (5), wherein the insulating layer contains an aluminum oxide ($Al_2O_3$) in a complete oxidation state.

(7) The thin-film transistor according to (5) or (6), wherein the protective film includes the lower oxide layer and the insulating layer in this order from the oxide semiconductor film side.

(8) The thin-film transistor according to (5) or (6), wherein the protective film includes the insulating layer and the lower oxide layer in this order from the oxide semiconductor film side.

(9) The thin-film transistor according to (5) or (6), wherein the protective film includes the lower oxide layer between a pair of the insulating layers.

(10) The thin-film transistor according to any one of (5) to (9), wherein the lower oxide layer has a thickness of about 5 nm or more.

(11) The thin-film transistor according to (3), wherein the aluminum lower oxide is contained in both of the first protective film and the second protective film.

(12) A method of manufacturing a thin-film transistor, the method including:
forming an oxide semiconductor film on a gate electrode, the oxide semiconductor film having a channel region that faces the gate electrode; and
forming a protective film covering at least the channel region, the protective film containing an aluminum lower oxide ($Al_XO_Y$, where $0<Y/X<3/2$) that absorbs light.

(13) The method according to (12), wherein in forming the protective film, a lower oxide layer made of the aluminum lower oxide and an insulating layer containing an aluminum oxide ($Al_2O_3$) in a complete oxidation state are formed by changing an oxygen supply quantity.

(14) A display unit provided with a plurality of devices and a thin-film transistor driving the plurality of devices, the thin-film transistor including:
a gate electrode;
an oxide semiconductor film having a channel region that faces the gate electrode; and
a protective film covering at least the channel region and containing an aluminum lower oxide ($Al_XO_Y$, where $0<Y/X<3/2$) that absorbs light.

(15) An electronic apparatus with a display unit that is provided with a plurality of devices and a thin-film transistor driving the plurality of devices, the thin-film transistor including:
a gate electrode;
an oxide semiconductor film having a channel region that faces the gate electrode; and
a protective film covering at least the channel region and containing an aluminum lower oxide ($Al_XO_Y$, where $0<Y/X<3/2$) that absorbs light.

(16) A thin-film transistor including:
a gate electrode;
a gate insulating film provided to cover the gate electrode;
an oxide semiconductor film provided on the gate insulating film;
a source electrode and a drain electrode each made of a transparent conductive oxide, and provided on the oxide semiconductor film;
a protective film made of a metal oxide, and provided on the source electrode and the drain electrode; and
a light-shielding film provided on the protective film,
wherein a distance between the oxide semiconductor film and the light-shielding film is about 2 nm or more and about 400 nm or less.

(17) The thin-film transistor according to (16), wherein the metal oxide is one of an aluminum oxide and a titanium oxide.

(18) The thin-film transistor according to (16) or (17), further including a low-resistance wiring, wherein the source electrode and/or the drain electrode are extended on the gate insulating film outside the oxide semiconductor film, and the low-resistance wiring is electrically connected to the source electrode and/or the drain electrode at extended parts.

(19) A method of manufacturing a thin-film transistor, the method including:
forming a gate electrode on a substrate;
forming a gate insulating film covering the gate electrode;
forming an oxide semiconductor film on the gate insulating film;
forming a channel protective film on the oxide semiconductor film;
forming each of a source electrode and a drain electrode on the oxide semiconductor film, the source electrode and the drain electrode each being made of a transparent conductive oxide; and
forming a protective film made of a metal oxide on the source electrode and the drain electrode, and forming a light-shielding film on the protective film,
wherein a distance between the oxide semiconductor film and the light-shielding film is about 2 nm or more and about 400 nm or less.

(20) The method according to (19), the method further including:
forming an electrode-exposing section by removing at least a part of the protective film and exposing an extended part of the source electrode and/or the drain electrode on the gate insulating film outside the oxide semiconductor film; and forming a low-resistance wiring on the electrode-exposing section and a light-shielding film on the channel region by forming and shaping a film made of a conductive material on the protective film and on the electrode-exposing section, the light-shielding film being disposed apart from the low-resistance wiring.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin-film transistor comprising:
a gate electrode;
a gate insulating film provided to cover the gate electrode;
an oxide semiconductor film provided on the gate insulating film;
a source electrode and a drain electrode each made of a transparent conductive oxide, and provided on the oxide semiconductor film;

a protective film made of a metal oxide, and provided on the source electrode and the drain electrode; and a light-shielding film provided on the protective film, wherein a distance between the oxide semiconductor film and the light-shielding film is about 2 nm or more and about 400 nm or less.

2. The thin-film transistor according to claim 1, wherein the metal oxide is one of an aluminum oxide and a titanium oxide.

3. The thin-film transistor according to claim 2, further comprising a low-resistance wiring, wherein the source electrode and/or the drain electrode are extended on the gate insulating film outside the oxide semiconductor film, and the low-resistance wiring is electrically connected to the source electrode and/or the drain electrode at extended parts.

4. The thin-film transistor according to claim 1, wherein the thickness of each of the source electrode and the drain electrode is 1 nm or more and about 200 nm or less.

5. The thin-film transistor according to claim 1, wherein the thickness of the protective film is 1 nm or more and about 200 nm or less.

6. The thin-film transistor according to claim 1, wherein the combined thickness of the source electrode and drain electrode with the protective film is about 2 nm or more and about 400 nm or less.

7. The thin-film transistor according to claim 1, wherein the light-shielding film covers an area of the oxide semiconductor film.

\* \* \* \* \*